US009343344B2

(12) United States Patent
Hashimoto et al.

(10) Patent No.: US 9,343,344 B2
(45) Date of Patent: May 17, 2016

(54) END EFFECTOR DEVICE

(71) Applicant: KAWASAKI JUKOGYO KABUSHIKI KAISHA, Kobe-shi, Hyogo (JP)

(72) Inventors: Yasuhiko Hashimoto, Kobe (JP); Takayuki Fukushima, Takarazuka (JP); Ryosuke Kanamaru, Kakogawa (JP); Daiki Miyagawa, Akashi (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 14/758,263

(22) PCT Filed: Dec. 25, 2013

(86) PCT No.: PCT/JP2013/007582
§ 371 (c)(1),
(2) Date: Jun. 29, 2015

(87) PCT Pub. No.: WO2014/103300
PCT Pub. Date: Jul. 3, 2014

(65) Prior Publication Data
US 2015/0357219 A1 Dec. 10, 2015

(30) Foreign Application Priority Data

Dec. 27, 2012 (JP) ................................ 2012-285790

(51) Int. Cl.
*B66F 19/00* (2006.01)
*H01L 21/677* (2006.01)
(Continued)

(52) U.S. Cl.
CPC ....... *H01L 21/67742* (2013.01); *B25J 11/0095* (2013.01); *H01L 21/67766* (2013.01); *H01L 21/67769* (2013.01); *H01L 21/67781* (2013.01); *H01L 21/68707* (2013.01)

(58) Field of Classification Search
CPC ................. H01L 21/67766; H01L 21/6776; H01L 21/67781; H01L 21/67742; H01L 21/67778; H01L 21/68707; B25J 11/0095; B25J 9/042; B25J 15/0052; B25J 15/04; B05B 13/0292; B65G 47/92
See application file for complete search history.

(56) References Cited

U.S. PATENT DOCUMENTS

| 2004/0013503 A1* | 1/2004 | Sandhu ............. H01L 21/67781 414/416.08 |
| 2008/0124206 A1* | 5/2008 | Choi ................. H01L 21/67781 414/744.2 |
| 2012/0004773 A1* | 1/2012 | Furuya ................ B25J 11/0095 700/245 |

FOREIGN PATENT DOCUMENTS

| JP | H05235147 A | 9/1993 |
| JP | H11163096 A | 6/1999 |

(Continued)

OTHER PUBLICATIONS

Feb. 18, 2014 International Search Report issued in International Application No. PCT/JP2013/007582.
(Continued)

Primary Examiner — Stephen Vu
(74) Attorney, Agent, or Firm — Oliff PLC

(57) ABSTRACT

The end effector device includes a hand having a storing space, and a plurality of holding portions provided to the hand and configured to respectively peripheral portions of each plate member. Each holding portion includes a plurality of receiving portions which respectively receive a plurality of plate members keeping vertical pitches among them, and a pitch changing mechanism configured to change intervals by vertically moving the plurality of receiving portions respectively. A plurality of linearly moving portions configured to respectively move linearly integrally with the plurality of receiving portions are provided to the hand being exposed outside of the hand, and a plurality of drive portions configured to drive the plurality of linearly moving portions of the pitch changing mechanism are stored in the storing space of the hand.

10 Claims, 14 Drawing Sheets

(51) Int. Cl.
*B25J 11/00* (2006.01)
*H01L 21/687* (2006.01)

(56) References Cited

FOREIGN PATENT DOCUMENTS

| JP | 2001118909 A | | 4/2001 |
|---|---|---|---|
| JP | 2001291759 A | | 10/2001 |
| JP | 2003309166 A | | 10/2003 |
| JP | 2005340729 A | | 12/2005 |
| JP | 2006-313865 A | | 11/2006 |
| WO | WO2005/112535 | * | 11/2015 |

OTHER PUBLICATIONS

Jun. 30, 2015 International Preliminary Report on Patentability issued in International Application No. PCT/JP2013/007582.

* cited by examiner

END EFFECTOR DEVICE

TECHNICAL FIELD

The present invention relates to an end effector device, particularly an end effector device provided with a pitch changing mechanism which changes a vertical pitch of a plurality of plate members arranged vertically at intervals.

BACKGROUND ART

In the processes for manufacturing semiconductors, for example, there is a conveying process which takes out in a horizontal direction a semiconductor wafer of a thin circular plate stored in a cassette (FOUP) under a state of horizontal posture, and conveys the semiconductor wafer to another spot where a predetermined process is applied to the semiconductor wafer.

A device for conveying a substrate, such as this semiconductor wafer, is disclosed in Patent Document 1 to be known. In this device, an arm is provided to a case so as to be rotatable in a horizontal plane, and a hand, on which a substrate is placed, is provided to the distal end portion of this arm. A motor as a driving source is disposed in the case, and from the motor to the hand, power transmitting members, such as a pulley and a belt, are disposed in a horizontal direction in multiple stages. Therefore, the distance from the motor to the hand in the horizontal plane is long. The power transmitting members are sealingly stored in the case and the hand.

When power is transmitted from the motor to the hand, the power transmitting members may rub each other so as to cause particles, such as powder dusts. However, the power transmitting members are sealingly stored in the hand, the particles are prevented from scattering from the inside of the case or the hand so that the particles do not adhere to the plate member.

On the other hand, Patent Document 2 discloses a conveyance device provided with a plurality of substrate holding members of plate shape which are disposed in the vertical direction with intervals, the intervals being able to be changed. A plurality of substrates are stored in a cassette with intervals in the vertical direction, and when the plurality of substrates are conveyed from the cassette to another spot, their vertical pitch may be changed. Therefore, according to this conveyance device, a plurality of substrates can be conveyed with their pitch coverted.

RELATED ART DOCUMENTS

Patent Documents

[Patent Document 1] Japanese Patent Application Laid-Open No. H4-92446
[Patent Document 2] Japanese Patent Application Laid-Open No. H5-235147

SUMMARY OF INVENTION

Objects to be Solved by the Invention

In general, a substrate conveyance robot, which has an excellent performance of conveying a substrate, is used for conveying a substrate. This substrate conveyance robot is required to prevent particles generated from its driving mechanism from adhering to the substrate which is being conveyed, as described in Patent Document 1. Also, when a substrate is conveyed, as described in Patent Document 2, it may be needed that a plurality of substrates are conveyed at the same time, and the vertical pitch of the substrates is changed at that time.

However, the substrate conveyance robot disclosed in Patent Document 1 cannot convey a plurality of substrates at the same time, and the pitch thereof cannot be changed.

On the other hand, in the conveyance device disclosed in Patent Document 2, a plurality of substrate holding members of plate shape corresponding to a so-called hand of a substrate conveyance robot are disposed in the vertical direction so as to be vertically movable. Therefore, by vertically moving the plurality of substrate holding members, the vertical pitch of the substrates held by the substrate holding members can be changed. However, the driving mechanism for vertically moving the substrate holding members are disposed on the lateral side of the substrate holding members so as to be exposed with respect to the substrate holding members. Therefore, there is a possibility that the particles generated in the driving mechanism may adhere to the substrates which are held by the substrate holding members. Moreover, since a plurality of hands are vertically moved, the mechanism for changing the pitch of the substrates is large-scale.

These problems are common for a robot which conveys a plate member, such as a substrate.

An object of the present invention is to provide an end effector device which has a pitch conversion mechanism for holding a plurality of plate members and changing the intervals of the plate members held by the same, the end effector device being capable of alleviating contamination of the plate members by particles which are generated in the pitch conversion mechanism.

Means for Solving the Objects

An end effector device according to an aspect of the present invention includes: a hand having a storing space; and a plurality of holding portions provided to the hand and configured to hold parts of each of a plurality of plate members so as to hold the plurality of plate members respectively, the parts being different from each other in a peripheral direction of a peripheral edge portion of each plate member respectively, wherein each of the holding portions includes a plurality of receiving portions which respectively receive peripheral edge portions of the plurality of plate members so that the plurality of plate members are arranged substantially parallel with one plane and at an interval mutually in a first direction which is substantially perpendicular to the one plane, and a pitch changing mechanism configured to linearly move the plurality of receiving portions in the first direction respectively so as to change the interval, wherein a plurality of linearly moving portions configured to respectively move linearly integrally with the plurality of receiving portions of the pitch changing mechanism are provided to the hand so as to be exposed outside of the hand, and wherein a plurality of drive portions configured to drive the plurality of linearly moving portions of the pitch changing mechanism respectively are stored in the storing space of the hand.

According to this configuration, the pitch conversion mechanism is divided into the linearly moving portions and the drive portions. Although the linearly moving portions are exposed outside of the hand, the linearly moving portions linearly move together with the receiving portions for receiving the plate members so that the plate members do not rub, and there is no actuation mechanism in the inside, as a result, no particle is generated. On the other hand, the drive portion include an actuation mechanism in its inside so that particles may be generated, but it is spaced from the receiving portions for receiving the plate members in the first direction as the arrangement direction of the plate members, and is stored in the inside of the hand. Thereby, the plate members can be prevented from being contaminated by the particles due to the pitch conversion mechanism.

Also, the drive portions of the pitch conversion mechanism exist just close to the receiving portions. Thereby, the accuracy of movement for changing the intervals of the receiving portions can be enhanced.

Moreover, the hand may include a hollow body portion formed so as to extend in a second direction substantially parallel with the one plane, and a hollow movable portion connected to a proximal end portion of the body portion so as to be capable of advancing and retreating in the second direction, and the plurality of holding portions may include first holding portions provided to a distal end portion of the body portion and second holding portions provided to the movable portion.

According to this configuration, the plate members are held by the receiving portions of the first holding portions provided to the distal end portion of the body portion of the hand and the receiving portions of the second holding portions provided to the movable portion of the hand so that the plate members are stably held.

Moreover, it may be configured that when the movable portion has advanced, the peripheral edge portions of the plurality of plate members are gripped by the first holding portions and the second holding portions so as to be held, and when the movable portion has retreated, the peripheral edge portions of the plurality of plate members are released from the second holding portions.

According to this configuration, the plurality of plate members are gripped by the first holding portions and the second holding portions so that the plate members can be prevented from displacing when the hand is moved.

Effect of the Invention

The present invention can provide an end effector device which has a pitch conversion mechanism for holding a plurality of plate members and changing the intervals of the plate members held by the same, the end effector device being capable of alleviating contamination of the plate members by particles which are generated in the pitch conversion mechanism.

EMBODIMENT OF THE INVENTION

Hereunder, an embodiment of the present invention will be described in detail using drawings. Note that, the same numerals are allocated to the same or corresponding parts in all of the drawings in the description below so as to omit overlapping descriptions. Also, the vertical direction is the same as up-and-down direction in the description below.

<General Configuration of Plate Member Conveying Robot>

The present invention relates to an end effector mounted to a distal end portion of an arm of a plate member conveying robot. First, the plate member conveying robot will be generally described. Also, although a disk-shaped semiconductor wafer is exemplified as a plate member conveyed by the plate member conveying robot, the plate member is not limited to the semiconductor wafer. For example, the plate member may be a thin liquid crystal display processed by a semiconductor process, or a glass substrate for organic EL display. Also, the semiconductor wafer is a substrate material of a semiconductor device, including a silicon wafer, a silicon carbide wafer, a sapphire wafer, or the like.

In the embodiment, the plate member conveying robot includes a pitch changing mechanism changing a vertical pitch of adjacent semiconductor wafers when conveying a plurality of semiconductor wafers from a FOUP to another spot for performing a predetermined process as hereunder. In the description below, the pitch changing mechanism performs the operation of widening a vertical pitch of adjacent semiconductor wafers when conveying a plurality of semiconductor wafers from a FOUP to another spot.

Figure 1A:
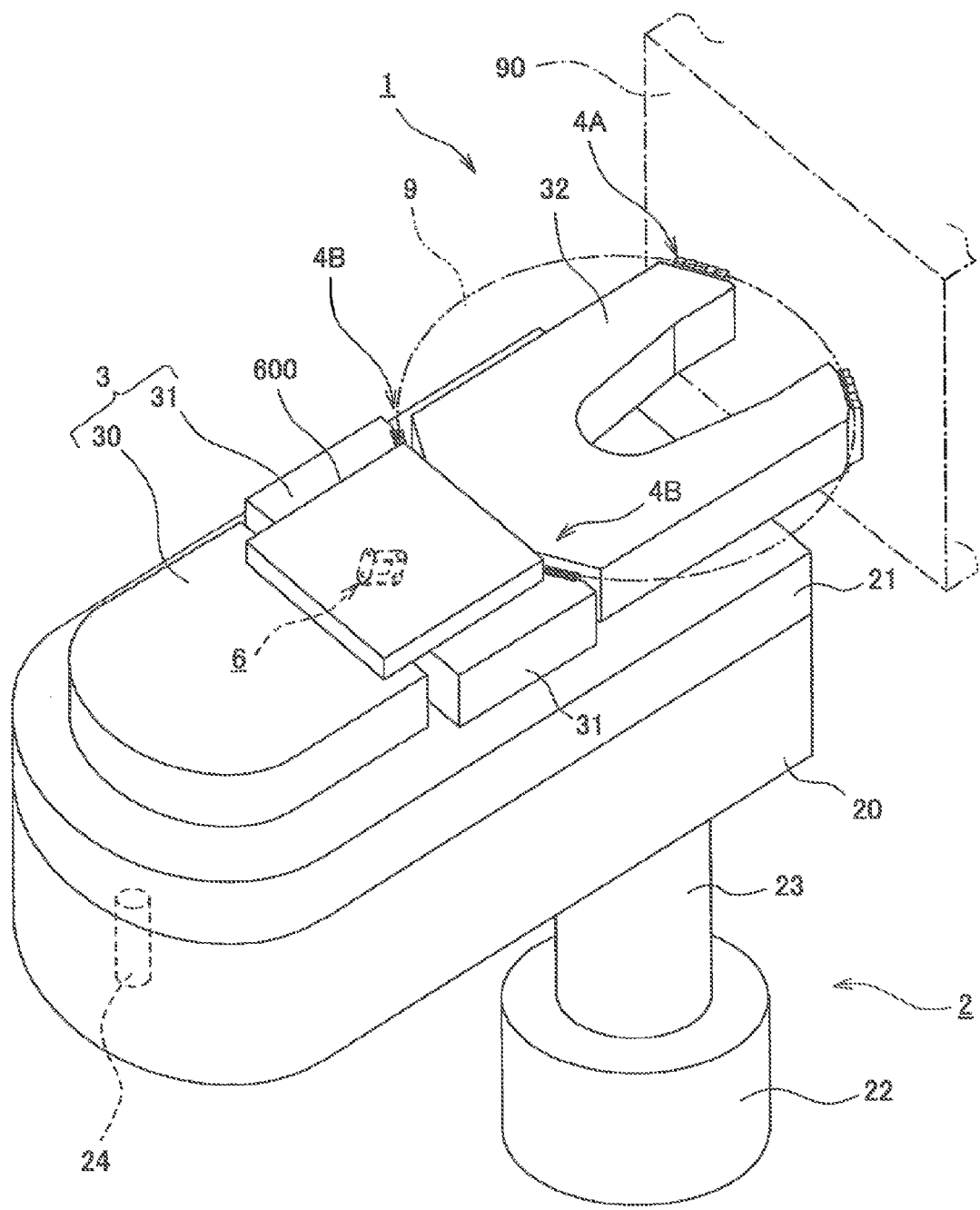
FIG. 1A is an entire perspective view illustrating the plate member conveying robot in which the end effector device according to an embodiment of the present invention is used.
Figure 1B:
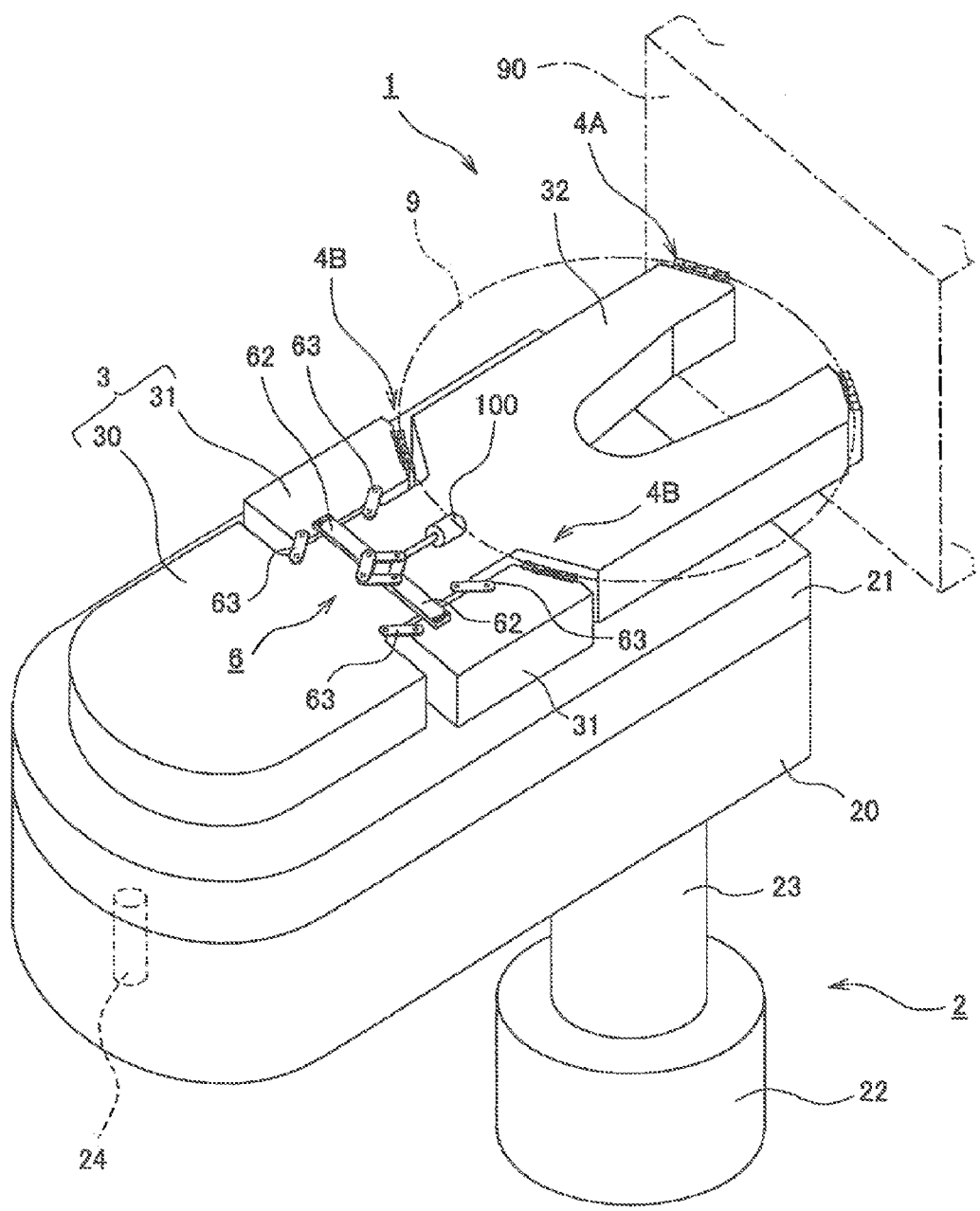
FIG. 1B is an entire perspective view illustrating the plate member conveying robot in which the end effector device according to an embodiment of the present invention is used.

Each of FIGS. 1A and 1B is an entire perspective view of a plate member conveying robot 2, FIG. 1A illustrating a state that a cover 600 described later is mounted and FIG. 1B illustrating a state that the cover 600 is removed, respectively. The plate member conveying robot 2 is a robot arranged in a semiconductor processing equipment so as to convey a plurality of semiconductor wafers, for example, being so called a horizontal articulated robot. The plate member conveying robot 2 is configured by a supporting base 22 fixed to a floor surface, an arm supporting shaft 23 vertically movable and turnably provided on the supporting base 22, and an arm 20 extending in the horizontal direction whose one end portion is rotatably mounted to an upper end portion of the arm supporting shaft 23, for example. One end portion of a base 21 extending in the horizontal direction overlapping with the arm 20 is provided to the other end portion of the arm 20 so as to rotate in the horizontal plane via a shaft body 24 extending vertically. Operations of the plate member conveying robot 2 and an end effector device 1 which will be described later are controlled by a control device which is not shown.

A hand 3 formed to be thick is provided on the base 21. A FOUP 90 storing a plurality of semiconductor wafers 9 vertically at intervals is provided in the semiconductor processing equipment opposing to a distal end portion of the hand 3. For convenience of explanation, in the embodiment, it is assumed that five semiconductor wafers 9 are stored in the height direction at equal intervals in the FOUP 90. The arm 20 rotates in the horizontal plane about the arm supporting shaft 23 as the center and also the base 21 rotates about the shaft body 24 as the center. Thereby, the hand 3 can approach and be move away with respect to the FOUP 90. In the description below, a moving direction of the hand 3 toward the FOUP 90 is referred to as a forward direction, and a moving direction that the hand 3 is moved away from the FOUP 90 is referred to as a rearward direction. Also, a direction perpendicular to the forward and rearward direction in the horizontal plane is referred to as a left and right direction. Additionally, movements of the hand 3 in the forward direction and the rearward direction are referred to as advance and retreat, respectively.

Here, the semiconductor processing equipment may be configured by a processing device and a conveying device. The processing device is a device performing a predetermined process to semiconductor wafers. The conveying device is a device conveying semiconductor wafers between the FOUP 90 and the processing device. The plate member conveying robot 2 may be arranged in the processing device or may be arranged in the conveying device.

Also, a mechanism which drives the hand 3 is referred to as a hand drive mechanism. In the embodiment, the hand drive mechanism is configured by the arm 20, base 21, supporting base 22, supporting shaft 23, and the shaft body 24. The hand drive mechanism is not limited to this configuration, and various configurations capable of conveying semiconductor wafers by driving the hand 3 can be employed. For example, configurations of orthogonal coordinate type, cylindrical coordinate type, articulated type, and parallel link type can be employed.

The hand 3 is provided with a body portion 30 fixed to the base 21 so that the longitudinal direction thereof is along the base 21, and two movable portions 31 positioned on both sides of the center portion in the longitudinal direction of the body portion 30 and provided so as to advance and retreat on the base 21. Both the body portion 30 and the movable portion 31 are formed to be hollow, and storing spaces consisting of the hollow part are formed therein. An opposed surface 32 horizontal to an area for holding a semiconductor wafer 9 is formed on a distal end portion of the body portion 30, and a plurality of, four in FIGS. 1A and 1B, holding portions each of which holds peripheral edge portions of the semiconductor wafers 9 are provided around the opposed surface 32. The holding portions are configured by two first holding portions 4A provided so as to be separated from each other on the left and right on the distal end portion of the body portion 30 and two second holding portions 4B provided on distal end portions of the movable portions 31, respectively. Namely, parts different from each other of the peripheral edge portion of the semiconductor wafer 9 are held by a plurality of first holding portions 4A and second holding portions 4B. The main portion of the end effector 1 to be mounted on the distal end portion of the plate member conveying robot 2 is configured by the hand 3 and the both holding portions 4A, 4B.

As illustrated in FIG. 1A, a cover 600 is provided on the center portion in the longitudinal direction of the body portion 30, and a four-joint link mechanism 6 in a parallelogram shape is provided inside of the cover 600, as illustrated in FIG. 1B.

Figure 2A:
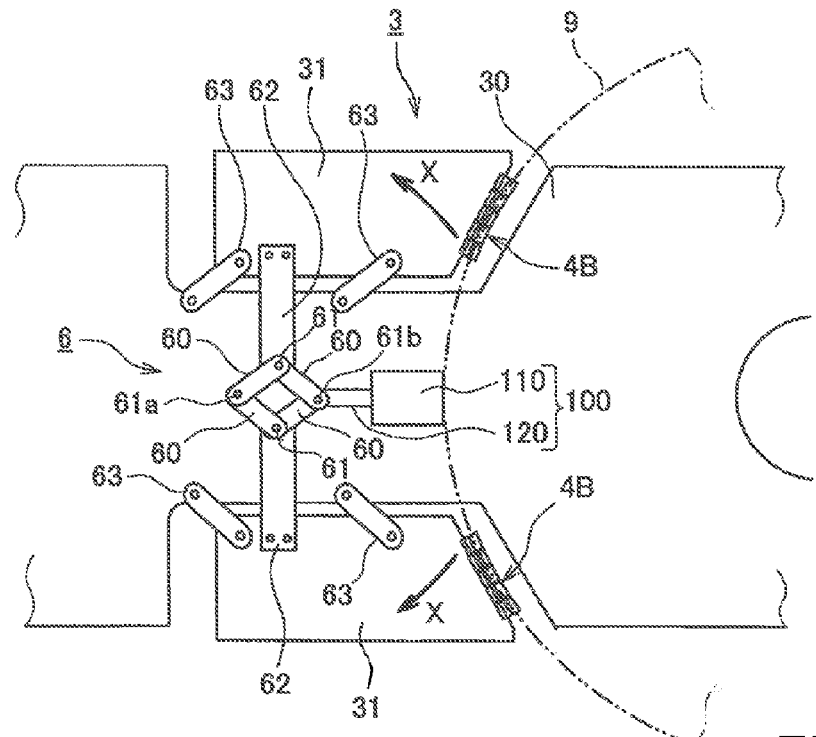
FIGS. 2A and 2B are plan views illustrating positional relations between the body portion and the movable portion.
Figure 2B:
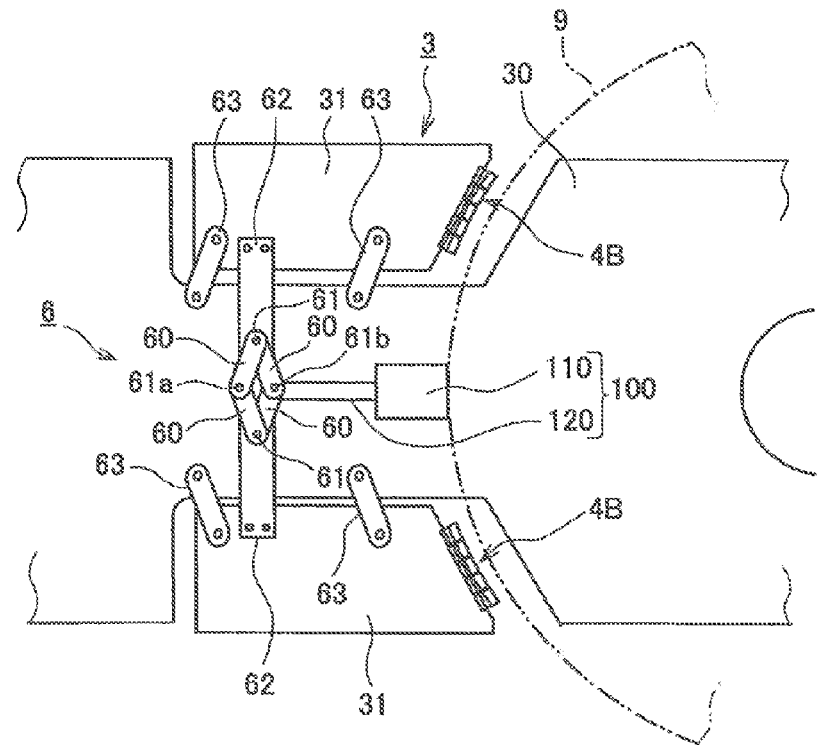

FIGS. 2A and 2B are plan views illustrating positional relations between the body portion 30 and the movable portion 31. The four-joint link mechanism 6 on the body portion 30 is configured by connecting four small link plates 60 with four connecting shafts 61, 61a, 61b so as to form a parallelogram shape. An actuator 100 is provided in front of the four-joint link mechanism 6, and the actuator 100 is configured in a housing 110, providing a piston 120 movably in the forward and rearward direction.

Of the four connecting shafts, the rearmost connecting shaft is fixed to the body portion 30, and this connecting shaft is referred to as a fixed connecting shaft 61a. The piston 120 of the actuator 100 is mounted to a connecting shaft positioned on a diagonal of the four-joint link mechanism 6 with respect to the fixed connecting shaft 61a. Thereby, the connecting shaft is driven forward and rearward. This connecting shaft is referred to as a driven connecting shaft 61b. Of the four connecting shafts, two connecting shafts 61 other than the fixed connecting shaft 61a and the driven connecting shaft 61b are connected to the movable portion 31 via a connecting plate 62 extending to the left and right respectively.

Two turning auxiliary link plates 63 connecting the movable portion 31 movably forward and rearward with respect to the body portion 30 are provided between the body portion 30 and each movable portion 31 so as to be in parallel with each other and separated forward and rearward from each other. Namely, the body portion 30, movable portion 31, and two turning auxiliary link plates 63 are connected to one another so as to configure a parallel link.

A mechanism driving the second holding portion 4B with respect to the body portion 30 is referred to as a second holding portion drive mechanism. The second holding portion drive mechanism is configured by the four-joint link mechanism 6, the connecting plate 62, the turning auxiliary link plate 63, and the movable portion 31 mentioned above in the embodiment. The second holding portion drive mechanism is not limited to this configuration, and an actuator such as an air cylinder in which a piston is fixed to the body portion 30 and a housing is fixed to the second holding portion 4B can be employed.

In a state that the piston 120 is retracted into the housing 110 as illustrated in FIG. 2A, the movable portions 31 are in an advanced state and the second holding portions 4B hold the peripheral edge portion of the semiconductor wafer 9. When the piston 120 is protruded from the housing 110 from this state as illustrated in FIG. 2B, the driven connecting shaft 61b moves to the rear. The two small link plates 60 positioned on the both sides of the fixed connecting shaft 61a turn so as to open from each other. Thereby, the connecting plates 62 arcuately move to the rear about the fixed connecting shaft 61a as the center. Note that, the small link plates 60 and the turning auxiliary link plates 63 are in parallel with each other, and the small link plates 60 and the turning auxiliary link plates 63 configure a parallelogram. The movable portions 31 are restricted by the turning auxiliary link plates 63 and retreat in a rotational direction (direction of arrow X in FIG. 2A) of the turning auxiliary link plates 63, respectively. As illustrated in FIG. 2B, the second holding portions 4B move away from the peripheral edge portion of the semiconductor wafer 9 so as to release the holding of the semiconductor wafer 9.

Namely, when taking out the semiconductors 9 from the FOUP 9, the movable portions 31 rotate in the advance direction and the second holding portions 4B hold the peripheral portion of the semiconductor wafer 9 as illustrated in FIG. 2A. When placing the taken-out semiconductor wafer 9 on another spot for performing a predetermined process, the actuator 100 is actuated so as to rotate the movable portions 31 in the retreat direction as illustrated in FIG. 2B. The second holding portions 4B move away from the peripheral edge portion of the semiconductor wafer 9 so as to release the holding of the semiconductor wafer 9.

When the small link plates 60 rotate, the small link plates 60 may rub each other, causing particles as a result. The cover 600 is put on the four-joint link mechanism 6 in order to prevent the particles from scattering. Accordingly, the cover 600 does not need to be provided when the four-joint link mechanism 6 is stored in the body portion 30.

In the embodiment, the first holding portions 4A are not displaced relatively in the horizontal direction with respect to the body portion 30. On the other hand, the second holding portions 4B are displaced relatively in the horizontal direction, specifically in the forward and rearward direction with respect to the body portion 30 of the hand 3. By configuring in this way, the operation of the second holding portion drive mechanism does not need to be transferred to the first holding portions 4A, enabling a drive system to be configured simply. Note that the operation of the first holding portions 4A in the horizontal direction is realized by driving the hand 3 by the hand drive mechanism.

Figure 3B:
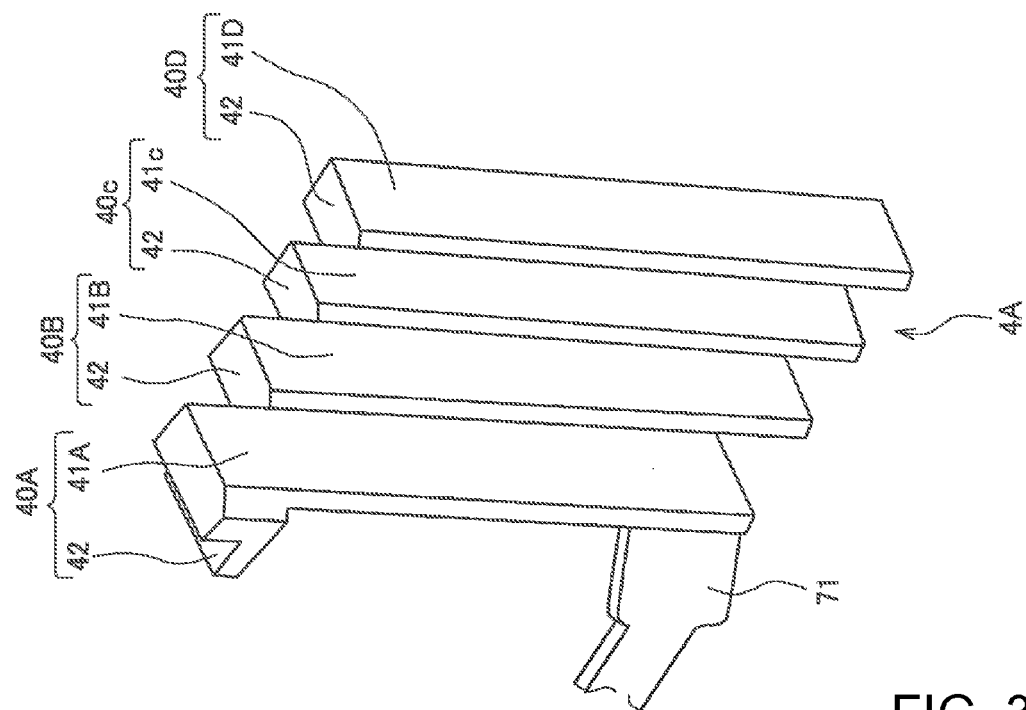
FIGS. 3A and 3B are perspective views illustrating the first holding portion.
Figure 3A:
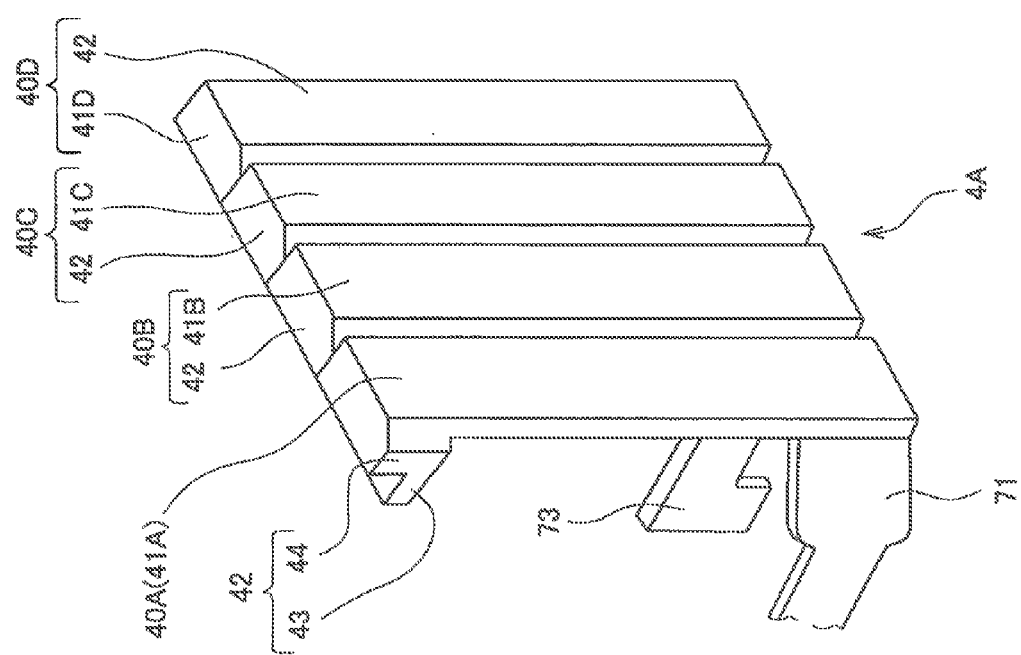

FIGS. 3A and 3B are perspective views of the first holding portion 4A. Although FIGS. 3A and 3B illustrate states of the first holding portion 4A on the left side of the body portion 30 in views from the front, the first holding portion on the right side of the body portion 30 has the same configuration.

The first holding portion 4A includes four linearly moving bodies 40A, 40B, 40C, 40D continued along the peripheral edge portion of the semiconductor wafer 9 corresponding to the number of semiconductor wafers 9 to be gripped and vertically moved and a pitch changing mechanism described later for elevating each linearly moving portions 40A, 40B, 40C, 40D by respective heights different from each other. While the number of semiconductor wafers 9 to be gripped is five, the number of the linearly moving bodies 40A, 40B, 40C, 40D is four. This is because the lowermost semiconductor wafer 9 is supported by a receiving portion 42 fixed on the hand 3 and is not elevated.

The four linearly moving bodies 40A, 40B, 40C, 40D are provided so as to be moved vertically, and each linearly moving body 40A, 40B, 40C, 40D is configured so as to provide the receiving portion 42 for supporting the lower surface of the peripheral edge portion of the semiconductor wafer 9 to the distal end portion, namely the upper end portion of each of linearly moving portions 41A, 41B, 41C, 41D which is a vertically elongated plate material. The receiving portion 42 is formed so that an abutting wall 44 protrudes upward from the proximal end portion of a horizontal piece 43, the horizontal piece 43 receives and supports the lower surface of the peripheral edge portion of the semiconductor wafer 9, and the abutting wall 44 abuts on the peripheral surface of the semiconductor wafer 9. In a state that the first holding portions 4A and the second holding portions 4B hold the semiconductor wafer 9, the semiconductor wafer 9 is pressed and held inwardly, specifically toward the center in the radial direction by the abutting walls 44 of the receiving portions 42 of the first holding portions 4A and the abutting walls 44 of the second holding portions 4B (refer to FIG. 15A), respectively. Namely, the semiconductor wafer 9 is gripped by an edge grip by the both holding portions 4A, 4B. Thereby, the semiconductor wafer 9 is surely gripped even when the base 21 and the arm 20 rotate at a high speed.

The four linearly moving portions 41A, 41B, 41C, 41D move from the state that heights of respective receiving portions 42 are uniform at the lowermost position as illustrated in FIG. 3A to the state that they elevate by straight distances corresponding to arrangement height positions of the semiconductor wafers 9 to be received by the receiving portions 42, as illustrated in FIG. 3B. The linearly moving portions 41A, 41B, 41C, 41D elevate so as to be lower in order along the peripheral edge portion of the semiconductor wafers 9, for example. Namely, the linearly moving portion 41A elevates to the highest level and the linearly moving portion 41D elevates to the lowest level. Thereby, a pitch as a vertical interval of a plurality of semiconductor wafers 9 respectively held by the linearly moving portions 41A, 41B, 41C, 41D are changed. In the following description, the linear moving portion which elevates to the highest level is referred to as a first linearly moving portion 41A, and the other linear moving portions are referred to as second, third, fourth linearly moving portions 41B, 41C, 41D respectively in the order of higher elevating height, for convenience of explanation. Note that, the order of elevation of the first to the fourth linearly moving portions 41A, 41B, 41C, 41D may be opposite to the above.

Note that, the second holding portion 4B is configured so as to include the four linearly moving portions 41A, 41B, 41C, 41D elevating so as to be high or low in order along the peripheral edge portion of the semiconductor wafer 9 and the pitch changing mechanism like the first holding portion 4A. The semiconductor wafer 9 is held by the receiving portions 42 of the first holding portions 4A and the receiving portions 42 of the second holding portions 4B positioned at the same height as the receiving portion 42 of the first holding portion 4A. In the state of being held by the receiving portions 42, the semiconductor wafer 9 is positioned in a plane substantially in parallel with the opposed surface 32 of the hand 3. Namely, the opposed surface 32 corresponds to the "one plane" in the present invention, and the vertical direction corresponds to the "first direction" in the present invention. Also, the forward and rearward direction is the "second direction" in the present invention.

In the embodiment illustrated in FIGS. 3A and 3B, all of the horizontal pieces 43 provided to one first holding portion 4A are arranged so as not to be overlapped with each other in a view from the top. Thereby, a pitch can be changed without interference of the horizontal pieces 43 with each other. Also, thereby, heights of the respective receiving portions 42 can be uniform at the lowermost position as illustrated in FIG. 3A, and therefore the heights of the distal end portion of the body portion 30 and the whole first holding portions when the pitch is the smallest (including 0 mm) can be small. Also, when at least two of a plurality of horizontal pieces 43 provided to one first holding portion 4A are arranged so as not to be overlapped with each other in a view from the top, a pitch can be changed without interference of the at least two horizontal pieces 43 with each other.

Figure 4A:
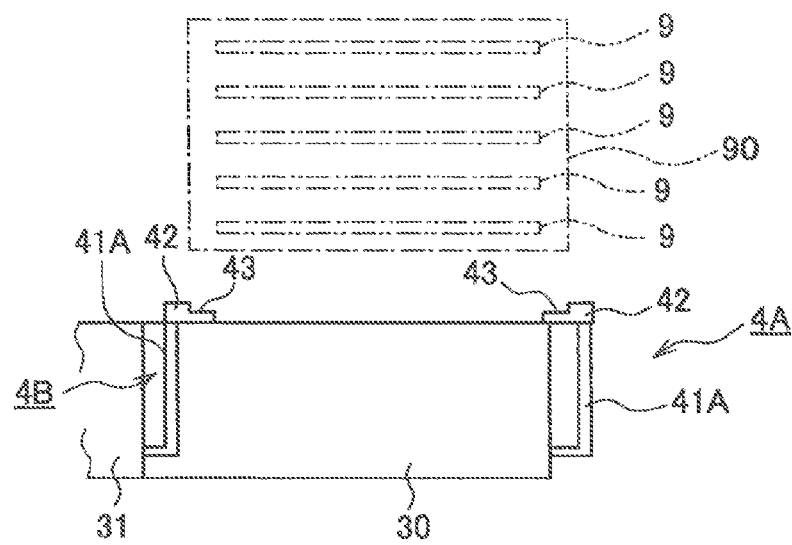
FIGS. 4A, 4B, and 4C are side views illustrating an example of the operation of the first holding portion and the second holding portion to hold a semiconductor wafer and vertically move the same.
Figure 4B:
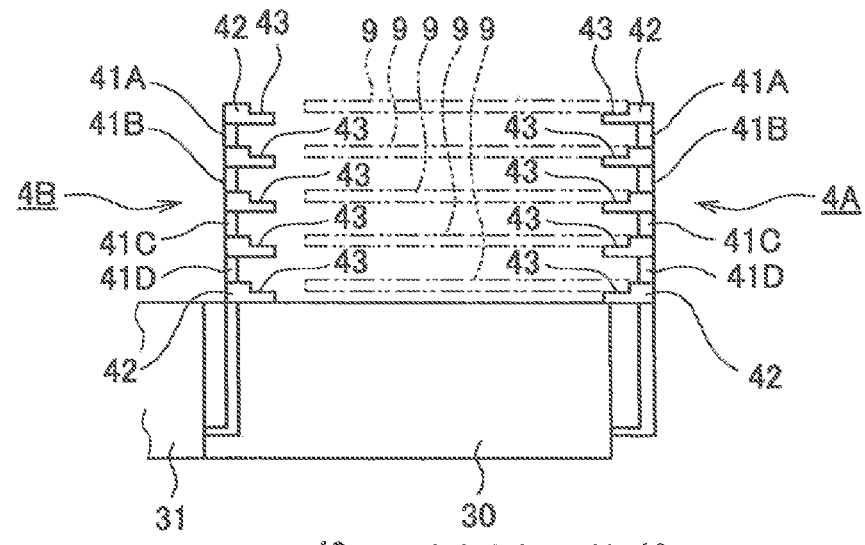
Figure 4C:
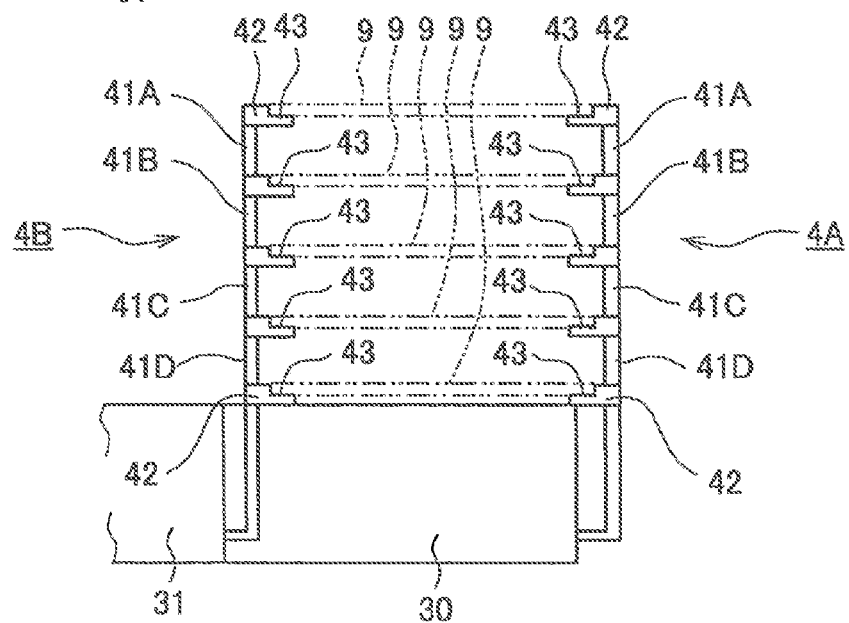

FIGS. 4A, 4B, and 4C are side views illustrating an example of the operation of the first holding portion 4A and the second holding portion 4B holding and elevating the semiconductor wafers 9. However, an operation of holding and elevating the semiconductor wafers 9 is not limited to this. In FIGS. 4B and 4C, the FOUP 90 is not illustrated for convenience of explanation. The plate member conveying robot 2 of the embodiment takes out five semiconductor wafers 9 having different height positions from each other from the FOUP 90 at the same time and widens the pitch of adjacent semiconductor wafers 9. In this state, the semiconductor wafers 9 are conveyed to another spot for process. The receiving portions 42 receiving the lowermost semiconductor wafer 9 are provided on the hand 3, and the first holding portion 4A and the second holding portion 4B elevate the remaining four semiconductor wafers 9.

The movable portion 31 is in a state of being moved away to the rear with respect to the body portion 30 as illustrated in FIG. 2B in a state that the hand 3 is opposed to the FOUP 90 (refer to FIG. 1B). From this state, the arm supporting shaft 23 lowers, and the arm 20 and the base 21 rotate in the horizontal plane so that the hand 3 advances. The hand 3 passes the lower side of the FOUP 90, and the first holding portions 4A are positioned on the front side below the semiconductor wafers 9 in the FOUP 90 and the second holding portions 4B are positioned on the rear side below the semiconductor wafers 9 in the FOUP 90. The first holding portions 4A and the second holding portions 4B are in a state that respective receiving portions 42 are uniform at the lowermost level as illustrated in FIG. 3A.

After that, the arm supporting shaft 23 elevates and also the receiving portions 42 of the first to fourth linearly moving portions 41A, 41B, 41C, 41D elevate by different heights respectively so that the horizontal piece 43 of each receiving portion 42 reaches a height corresponding to the lower surface (slightly lower position) of the corresponding semiconductor wafer 9. The arm 20 and the base 21 rotate in the horizontal plane and the hand 3 retreats slightly so that a state that each receiving portion 42 of the first holding portion 4A comes in contact with the peripheral edge portion of the corresponding semiconductor wafer 9 as illustrated in FIG. 4B is achieved. In this state, the second holding portions 4B are positioned in the rear of the semiconductor wafer 9.

After that, as illustrated in FIG. 2A, the piston 120 of the actuator 100 is retracted into the housing 110, and the movable portion 31 rotates in the advance direction so that the second holding portions 4B come in contact with the peripheral edge portion of the semiconductor wafer 9. In this state, the arm supporting shaft 23 elevates slightly, and the first holding portions 4A and the second holding portions 4B vertically move the semiconductor wafers 9 slightly from the FOUP 90. The arm 20 and the base 21 rotate in the horizontal plane and the hand 3 retreats so that the semiconductor wafers 9 can be taken out from the FOUP 90.

After taking out the semiconductor wafers 9 from the FOUP 90, the receiving portions 42 of the first to fourth linearly moving portions 41A, 41B, 41C, 41D further elevate by different heights respectively so that a pitch between the adjacent semiconductor wafers 9 can be widen as illustrated in FIG. 4C. The arm 20 and the base 21 rotate in the horizontal plane, and a plurality of semiconductor wafers 9 whose pitch is widen are conveyed to another spot for process. Note that it is expected that differences in height between the receiving portions 42 of adjacent linearly moving portions are all equal in a state that the receiving portions 42 of all of the linearly moving portions 41A, 41B, 41C, 41D have finished elevating. Hereunder, the pitch changing mechanism 7 for elevating the receiving portions 42 of the respective linearly moving portions 41A, 41B, 41C, 41D by the different heights respectively will be described.

<Configuration and Operation of Pitch Changing Mechanism>

Figure 5:
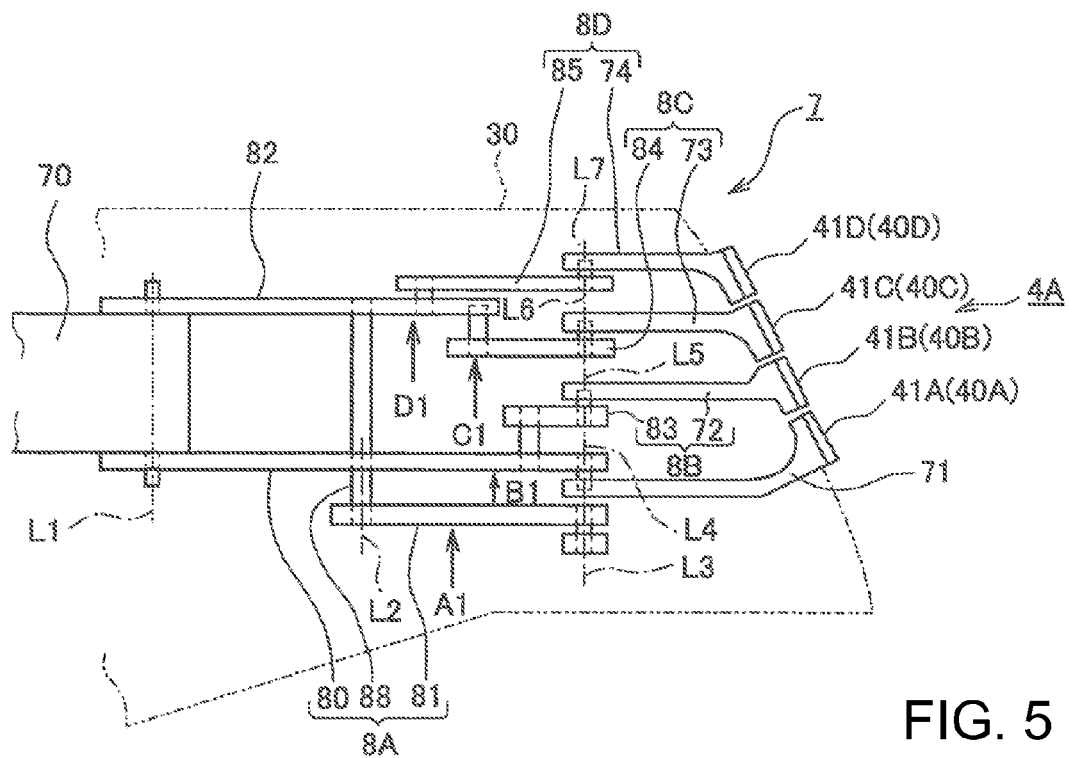
FIG. 5 is a plan view illustrating the storing space of the body portion of the hand.
Figure 6:
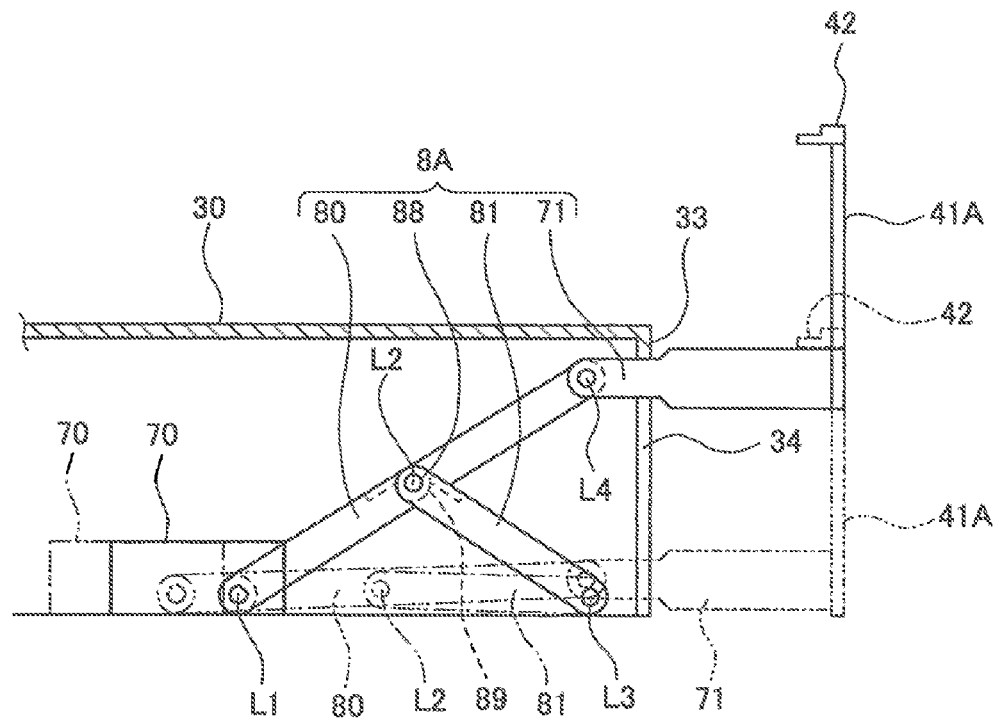
FIG. 6 is a side view illustrating the pitch changing mechanism of FIG. 5 in a view from the A1 direction.

FIG. 5 is a plan view illustrating the storing space of the body portion 30 of the hand 3, illustrating the pitch changing mechanism 7. FIG. 6 is a side view of the pitch changing mechanism 7 in FIG. 5 in a view from the A1 direction, and the base 21 is not illustrated. The first holding portion 4A and the second holding portion 4B includes the same pitch changing mechanism 7 respectively, and the pitch changing mechanism 7 of the first holding portion 4A positioned on the left side of the hand 3 in FIG. 1B is illustrated in FIG. 5 for convenience of explanation.

The pitch changing mechanism 7 is configured by the respective linearly moving portions 41A, 41B, 41C, 41D, a first slider 70 sliding forward and rearward in the body portion 30, and first to fourth link mechanisms 8A, 8B, 8C, 8D which are coupled to the first slider 70 and the respective linearly moving portions 41A, 41B, 41C, 41D and changing a forward and rearward movement of the first slider 70 into a vertical movement and arranged in the storing space in the body portion 30. Namely, in the pitch changing mechanism 7, the first to fourth linearly moving portions 41A, 41B, 41C, 41D are positioned outside of the body portion 30, and the first slider 70 and the first to fourth link mechanisms 8A, 8B, 8C, 8D are positioned in the storing space of the body portion 30. Also, since the semiconductor wafer 9 is positioned above the body portion 30 as illustrated in FIG. 1B, the first slider 70 of the pitch changing mechanism 7 and the first to fourth link mechanisms 8A, 8B, 8C, 8D exist immediately close to the receiving portions 42 for holding the semiconductor wafers 9. The "Drive portion" of the present invention is configured by the first slider 70 and the first to fourth link mechanisms 8A, 8B, 8C, 8D.

In FIG. 5, the link mechanism positioned innermost of the body portion 30 is referred to as the first link mechanism 8A, and the other link mechanisms are referred to as the second, third, fourth link mechanism 8B, 8C, 8D respectively toward the outside. The first to fourth link mechanisms 8A, 8B, 8C, 8D are connected to the corresponding first to fourth linearly moving portions 41A, 41B, 41C, 41D.

As illustrated in FIG. 6, the first link mechanism 8A includes a first link member 80 as a long plate which is provided to one side portion of the first slider 70 and whose proximal end portion is mounted on the first slider 70 turnably, a second link member 81 whose distal end portion is turnably mounted around a connecting shaft 88 positioned in the center portion in the longitudinal direction of the first link member 80 and whose proximal end portion is turnably mounted on the bottom surface of the body portion 30, and a second slider 71 turnably mounted on the distal end portion of the first link member 80 and fixed to the lower end portion of the first linearly moving portion 41. The first link member 80 turns about a first axis line L1 which is the center of a mounting spot with the first slider 70 and extends in the left and right direction, and the connecting shaft 88 is centered at a second axis line L2 in parallel with the first axis line L1. Also, a mounting spot of the second link member 81 to the bottom surface of the body portion 30 is centered at a third axis line L3 in parallel with the first axis line L1 and the second axis line L2. The second slider 71 is centered at a fourth axis line L4 in parallel with the first axis line L1 and the second axis line L2. The distance between the second axis line L2 and the third axis line L3 is substantially equal to the distance between the first axis line L1 and the second axis line L2 and the distance between the second axis line L2 and the fourth axis line L4. Also, the first axis line L1, the second axis line L2, and the fourth axis line L4 are positioned on substantially the same plane.

The second slider 71 is fitted in a vertically long hole 34 made in a front wall 33 which is a front end portion of the body portion 30, and therefore the forward and rearward movement is restricted and only the vertical movement is allowed.

Note that, as illustrated in FIG. 5, on a side portion of the first slider 70 which is the side opposite to the side to which the first link member 80 is provided, the proximal end portion of a third link member 82 which is a long plate and shorter than the first link member 80 is mounted, and the third link member 82 is turnably provided about the first axis line L1 as the center. Also, the connecting shaft 88 is extended in parallel with the first axis line L1 and connected to the third link member 82. As described later, when the first link member 80 and the second link member 81 turn, the third link member 82 turns as well via the connecting shaft 88.

In a state that the first slider 70 retreats, as shown by short dash lines in FIG. 6, both the first link member 80 and the second link member 81 are in a substantially horizontal position, and the second slider 71 and the receiving portion 42 of the first linearly moving portion 41A are positioned at the lowermost level.

As illustrated by solid lines in FIG. 6, when the first slider 70 advances, the second slider 71 cannot move fourth-back and only the vertical movement is allowed, and therefore, the first link member 80 turns about the first axis line L1 as the center so that the second slider 71 faces upward. The second link member 81 also turns about the third axis line L3 as the center so that the connecting shaft 88 faces upward. When the first slider 70 advances by a predetermined distance, the second slider 71 and the receiving portion 42 of the first linearly moving portion 41 reach to the uppermost level. When the first slider 70 retreats from this state, the first linearly moving portion 41A lowers according to an operation opposite to the operation above. Note that, as the second link member 81 is for supporting the turning of the first link member 80, this may be omitted.

Note that, when the first slider 70 advances from a state that the first link member 80 and the second link member 81 are in the substantially horizontal position, there is a possibility that both the link members 80, 81 are pressed against each other and they do not turn upward. In other words, when the second axis line L2 of the connecting shaft 88 is in a dead point of the first link member 80 and the second link member 81, there is a possibility that both the link members 80, 81 are pressed against each other and they do not turn upward.

Then, a torsion spring 89 shown by short dash lines in FIG. 6 may be provided about the connecting shaft 88 and a leg piece of the torsion spring 89 may be mounted on the first link member 80 and the second link member 81 so that the connecting shaft 88 is biased upward. Namely, the torsion spring 89 configures the "biasing mechanism for biasing in the direction opposite to the dead point" in the present invention. Also, when the second axis line L2 is positioned above the first axis line L1 and the third axis line L3 in a state that the second slider 71 is positioned in the lowermost level, the possibility that both the link members 80, 81 are pressed against each other when the first slider 70 advances is eliminated.

Figure 7:
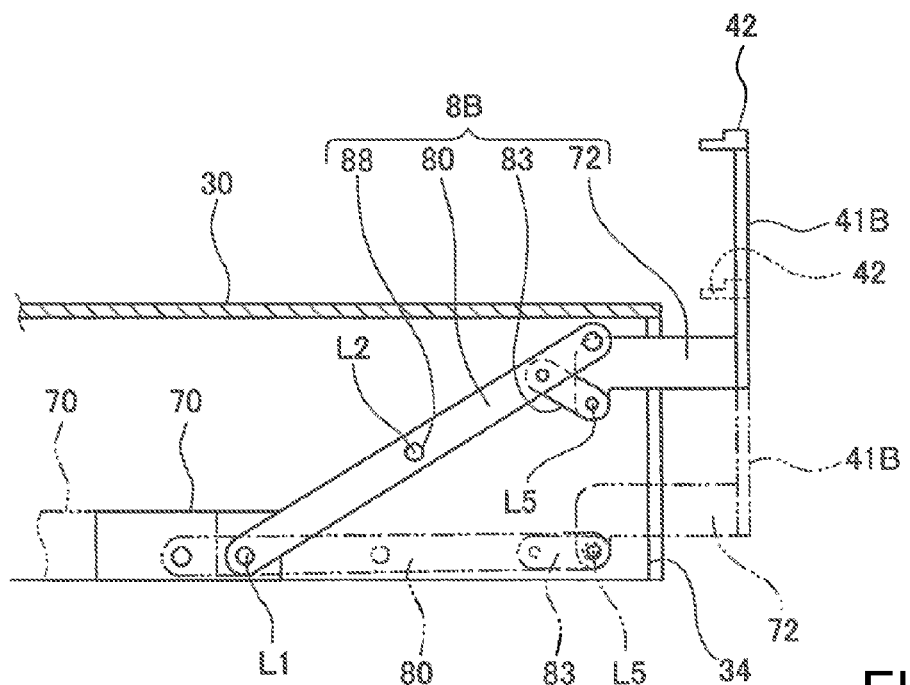
FIG. 7 is a side view illustrating the pitch changing mechanism of FIG. 5 in a view from the B1 direction.

FIG. 7 is a side view of the pitch changing mechanism 7 in FIG. 5 in a view from the B1 direction, illustrating the second link mechanism 8B. The second link mechanism 8B includes the first link member 80, a fourth link member 83 whose one end portion is turnably mounted on the distal end portion of the first link member 80, and a third slider 72 mounted turnably on the other end portion of the fourth link member 83 and fixed to the lower end portion of the second linearly moving portion 41B. A mounting spot of the fourth link member 83 and the third slider 72 is centered at a fifth axis line L5 in parallel with the fourth axis line L4 and positioned on substantially the same vertical plane. The fourth link member 83 is mounted on a surface of the first link member 80 opposite to the surface on which the second link member 81 is mounted on the first link member 80.

In a state that the first slider 70 retreats, both the first link member 80 and the fourth link member 83 are in a substantially horizontal position as shown by short dash lines in FIG. 7, and the third slider 72 and the receiving portion 42 of the second linearly moving portion 41B are positioned at the lowermost level.

As shown by solid lines in FIG. 7, when the first slider 70 advances, the first link member 80 turns about the first axis line L1 as the center so that the third slider 72 faces upward as mentioned above. When the first slider 70 advances by a predetermined distance, the fourth link member 83 is inclined so that the other end portion thereof faces downward by the weight of the second linearly moving portion 41B, and the third slider 72 and the receiving portion 42 of the second linearly moving portion 41B reach the uppermost level.

Figure 8:
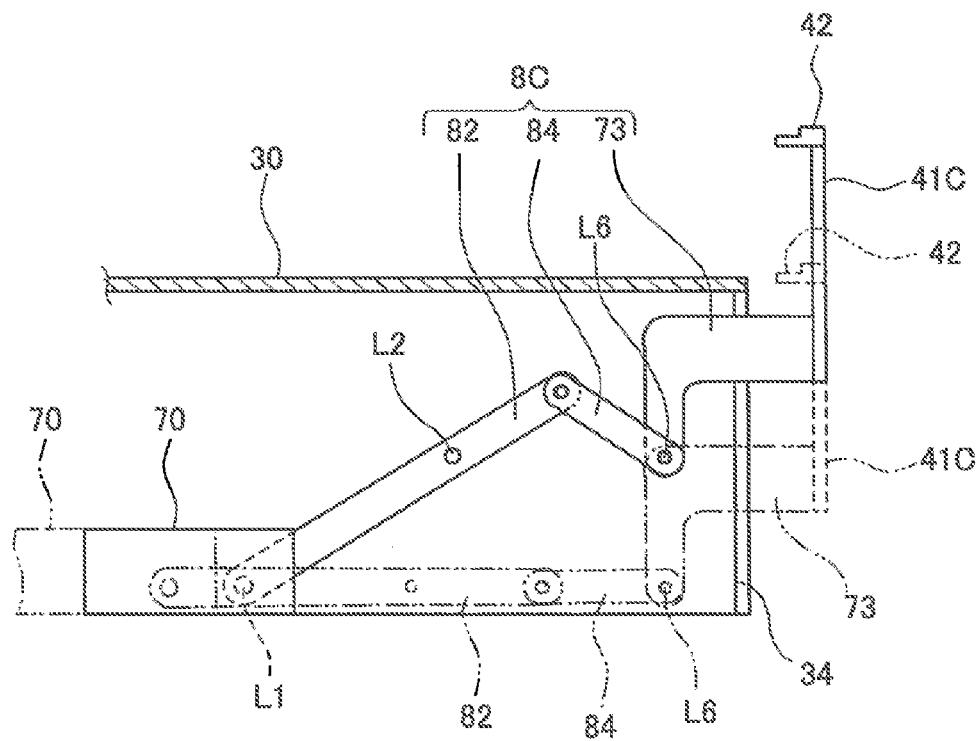
FIG. 8 is a side view illustrating the pitch changing mechanism of FIG. 5 in a view from the C1 direction.

FIG. 8 is a side view of the pitch changing mechanism 7 in FIG. 5 in a view from the C1 direction, illustrating the third link member 8C. The third link member 8C includes the third link member 82, a fifth link member 84 whose one end portion is turnably mounted on the distal end portion of the third link member 82, and a fourth slider 73 mounted turnably on the other end portion of the fifth link member 84 and fixed to the lower end portion of the third linearly moving portion 41C. A mounting spot of the fifth link member 84 and the fourth slider 73 is centered at a sixth axis line L6 in parallel with the fourth axis line L4 and positioned on the above-mentioned vertical plane.

In the state that the first slider 70 retreats, both the third link member 82 and the fifth link member 84 are in a substantially horizontal position as shown by short dash lines in FIG. 8, and the fourth slider 73 and the receiving portion 42 of the third linearly moving portion 41C are positioned at the lowermost level.

As shown by solid lines in FIG. 8, when the first slider 70 advances, the third link member 82 turns about the first axis line L1 as the center so that the fourth slider 73 faces upward as mentioned above. When the first slider 70 advances by a predetermined distance, the fifth link member 84 is inclined so that the other end portion thereof faces downward by the weight of the third linearly moving portion 41C, and the fourth slider 73 and the receiving portion 42 of the third linearly moving portion 41C reach the uppermost level.

Figure 9:
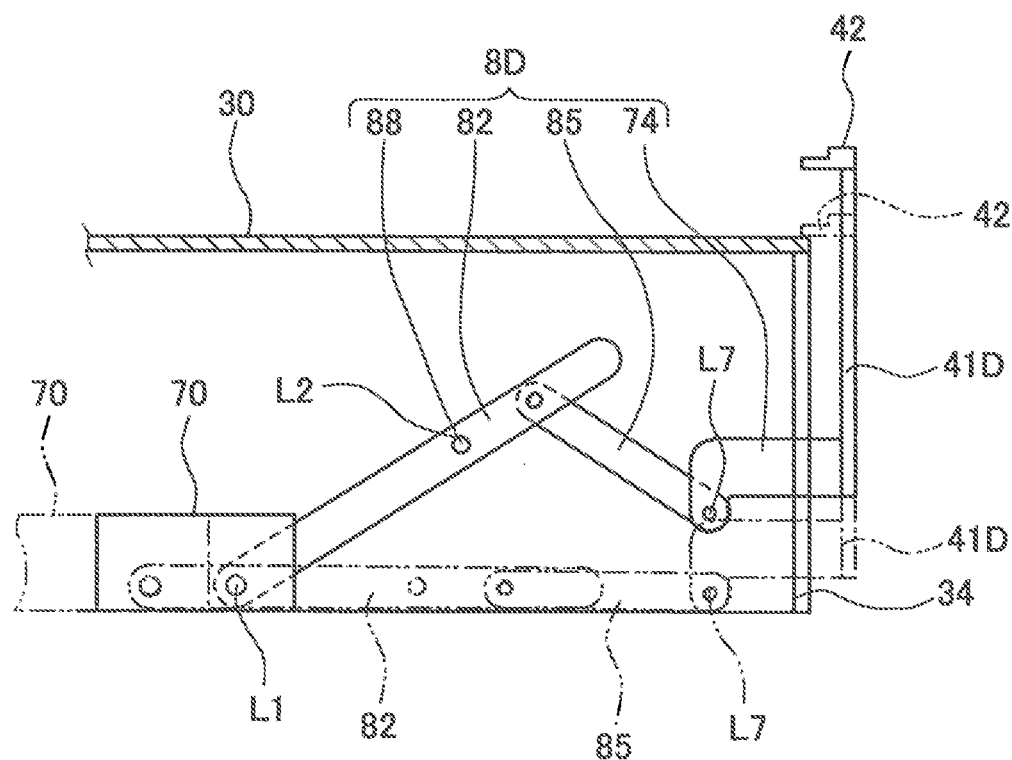
FIG. 9 is a side view illustrating the pitch changing mechanism of FIG. 5 in a view from the D1 direction.

FIG. 9 is a side view of the pitch changing mechanism 7 in FIG. 5 in a view from the D1 direction, illustrating the fourth link mechanism 8D. The fourth link mechanism 8D includes the third link member 82, a sixth link member 85 whose one end portion is turnably mounted on the distal end portion of the third link member 82, and a fifth slider 74 mounted turnably on the other end portion of the sixth link member 85 and fixed to the lower end portion of the fourth linearly moving portion 41D. A mounting spot of the sixth link member 85 and the fifth slider 74 is centered at a seventh axis line L7 in parallel with the fourth axis line L4 and positioned on the above-mentioned vertical plane. The sixth link member 85 is mounted on a surface of the third link member 82 opposite to the surface on which the fifth link member 84 is mounted on the third link member 82.

In the state that the first slider 70 retreats, both the third link member 82 and the sixth link member 85 are in a substantially horizontal position as shown by short dash lines in FIG. 9, and the fifth slider 74 and the receiving portion 42 of the fourth linearly moving portion 41D are positioned at the lowermost level.

When the first slider 70 advances, as shown by solid lines in FIG. 9, the third link member 82 turns about the first axis line L1 as the center so that the fifth slider 74 faces upward as mentioned above. When the first slider 70 advances by a predetermined distance, the sixth link member 85 is inclined so that the other end portion thereof faces downward by the weight of the fourth linearly moving portion 41D, and the fifth slider 74 and the receiving portion 42 of the fourth linearly moving portion 41D reach the uppermost level.

The torsion spring 89 may be fitted in the connecting shaft 88 and a leg piece of the torsion spring 89 may be mounted on the third link member 82 and the sixth link member 85 so that the connecting shaft 88 is biased upward.

Note that, although the pitch changing mechanism 7 of the first holding portion 4A provided in the body portion 30 is described above, the second holding portion 4B provided to the movable portion 31 also has the pitch changing mechanism 7 having the same configuration as mentioned above. Accordingly, the receiving portions 42 of both the holding portions 4A, 4B for holding the semiconductor wafers 9 are changeable in height by the pitch changing mechanisms 7. The four pitch changing mechanisms 7 in total of each of the first holding portion 4A and the second holding portion 4B are driven synchronously. Namely, the first sliders 70 of the four pitch changing mechanisms 7 are driven synchronously. A configuration for driving the four first sliders 70 synchronously will be described later.

As mentioned above, the respective mounting spots of the respective link members 81, 82, 83, 84 and the sliders 71, 72, 73, 74 for driving the first to fourth linearly moving portions 41A, 41B, 41C, 41D to be elevated are centered at the fourth to seventh axis lines L4 to L7 which are all positioned on the same vertical plane. Namely, a plurality of mounting spots are all positioned in the same position in the fourth-back direction.

Also, the first link member 80 and the third link member 82 turn synchronously with each other by the connecting shaft 88 passing through the second axis line L2. Namely, with regard to the respective first to fourth link mechanisms 8A, 8B, 8C, 8D, the sums of a first distance between the first axis line L1 and the second axis line L2 and a second distance between the second axis line L2 and the fourth to seventh axis lines L4 to L7 when the first link member 80 and the third link member 82 are in the horizontal state are the same distance with one another.

Also, with regard to the first to fourth link mechanisms 8A, 8B, 8C, 8D, the mounting spot of the second link member 81 and the fourth link member 83 on the first link member 80, and the mounting spot of the fifth link member 84 and the sixth link member 85 on the second link member 82 are all in different positions in the forward and rearward direction. Accordingly, the second distances 2 between the second axis line L2 and the fourth to seventh axis lines L4 to L7 when the first link member 80 and the third link member 82 turn to elevate are different from each other with respect to the respective first to fourth link mechanisms 8A, 8B, 8C, 8D. Namely, since the predetermined distance as the advance distance of the first slider 70 is the same with respect to the respective first to fourth link mechanisms 8A, 8B, 8C, 8D, ratios of the second distances with respect to the predetermined distance when the first link member 80 and the third link member 82 turn to elevate are different from each other with respect to the first to fourth linearly moving portions 41A, 41B, 41C, 41D.

Thereby, the heights that the receiving portions 42 of the first to fourth linearly moving portions 41A, 41B, 41C, 41D elevate are different from each other. Namely, the link mechanisms for elevating the first to fourth linearly moving portions 41A, 41B, 41C, 41D can be suitably realized according to the height positions of the semiconductor wafers 9 to be held by the receiving portions 42 of the respective first to fourth linearly moving portions 41A, 41B, 41C, 41D.

Component members of the first to fourth link mechanisms 8A, 8B, 8C, 8D are rotated as mentioned above in order to change the pitch of vertically adjacent semiconductor wafers 9, and then the component members of the link mechanisms may be rubbed with each other so as to generate particles as a result. When such particles are adhered to the semiconductor wafer 9, the semiconductor wafer 9 may be deteriorated in quality.

In the present embodiment, as the first to fourth link mechanisms 8A, 8B, 8C, 8D are arranged in the storing spaces of the body portion 30 and the movable portion 31 of the hand 3, the particles do not go out of the body portion 30 and the movable portion 31, and therefore there is no possibility that the particles adhere to the semiconductor wafer 9. Further, in order to prevent the particles from going out of the body portion 30 and the movable portion 31, the insides of the storing spaces of the body portion 30 and the movable portion 31 are set to negative pressure.

Also, the pitch changing mechanism 7 is positioned immediately below the receiving portion 42 of each linearly moving body 40A, 40B, 40C, 40D. Thereby, accuracy of the operation of changing the interval of the receiving portions 42 can be enhanced.

<Drive Mechanism of First Slider>

Figure 10:
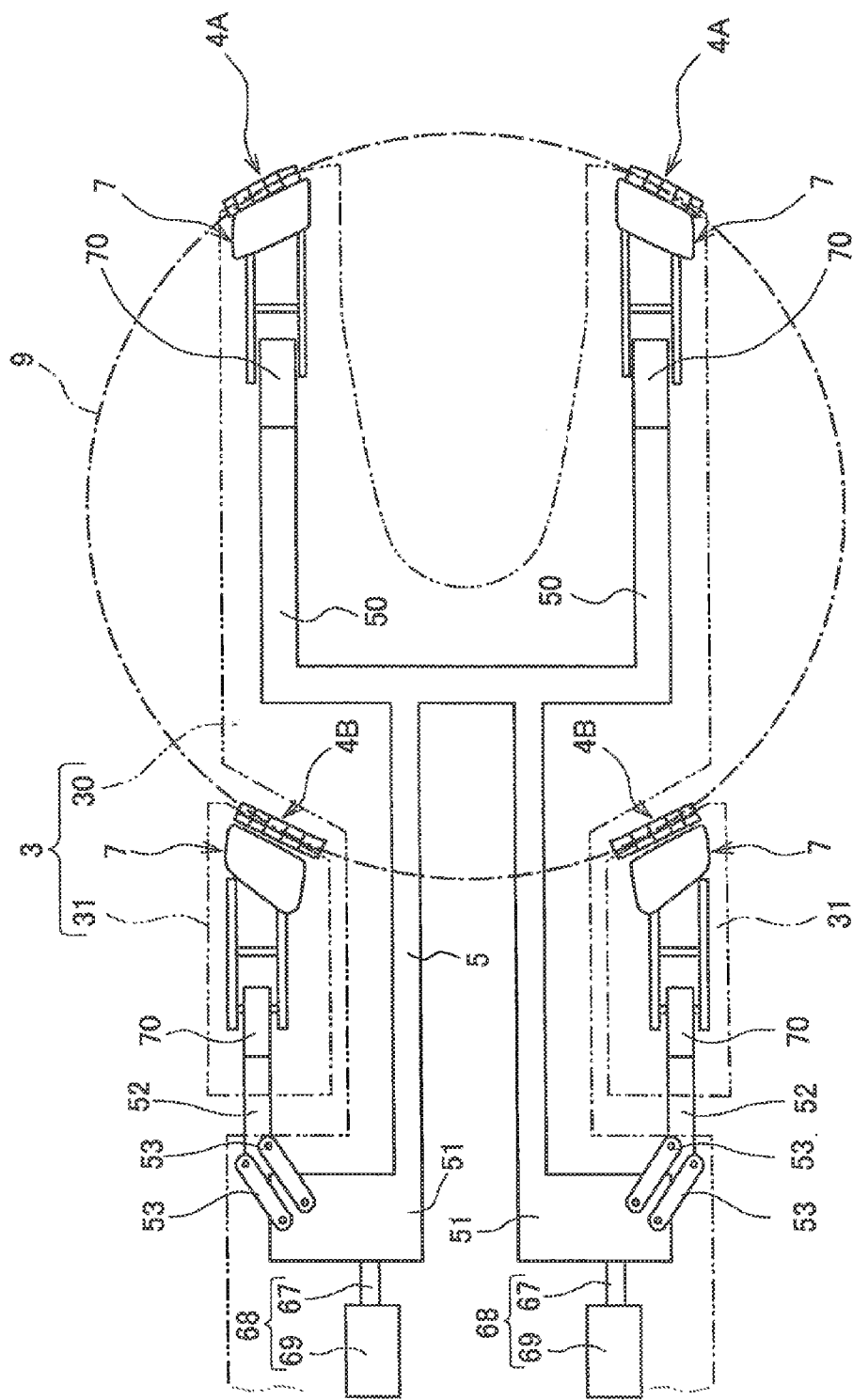
FIG. 10 is a plan view illustrating the mechanism synchronously driving four first sliders forward and rearward.

FIG. 10 is a plan view illustrating a mechanism which synchronizes and drives the four first sliders 70 forward and rearward, showing the body portion 30 and the movable portion 31 configuring the hand 3 by short dash lines. In the storing space of the body portion 30, a main slide body 5, which is a rigid body extending forward and rearward, is provided so as to move forward and rearward. The main slide body 5 has a pair of first drive pieces 50 separated from each other along the left and right direction of the body portion 30 on the front end portion thereof and has a pair of second drive pieces 51 separated from each other along the left and right direction of the body portion 30 on the rear end portion thereof. A first slider 70 configuring the pitch changing mechanism of the first holding portion 4A is mounted on the distal end portion of each first drive piece 50.

Air cylinders 68 are opposed to each other behind the respective second drive pieces 51, and the air cylinder 68 is configured to provide a piston 67 in a housing 69 movably in the forward and rearward direction. The distal end portions of the pistons 67 are connected to the second drive pieces 51, and the main slide body 5 is driven forward and rearward by both the air cylinders 68. Note that, although the main slide body 5 is driven by the two air cylinders 68, it may be driven by one air cylinder 68.

A sub-slide body 52 extending forward and rearward is provided in each movable portion 31 movably forward and rearward, and each sub-slide body 52 is coupled to the second drive piece 51 by a pair of coupling links 53 configured to turn in a horizontal plane. A first slider 70 configuring the pitch changing mechanism 7 of the second holding portion 4B is provided to the front end portion of each sub-slide body 52.

Figure 11A:
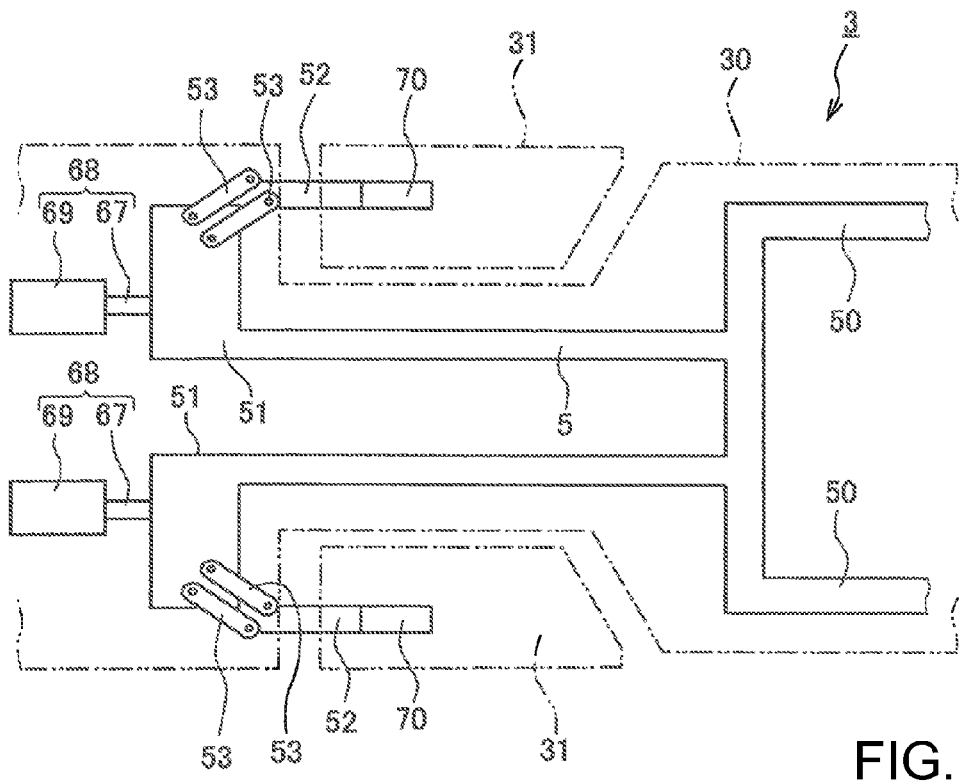
FIGS. 11A and 11B are plan views illustrating positional relations between the second drive piece and the sub-slide body.
Figure 11B:
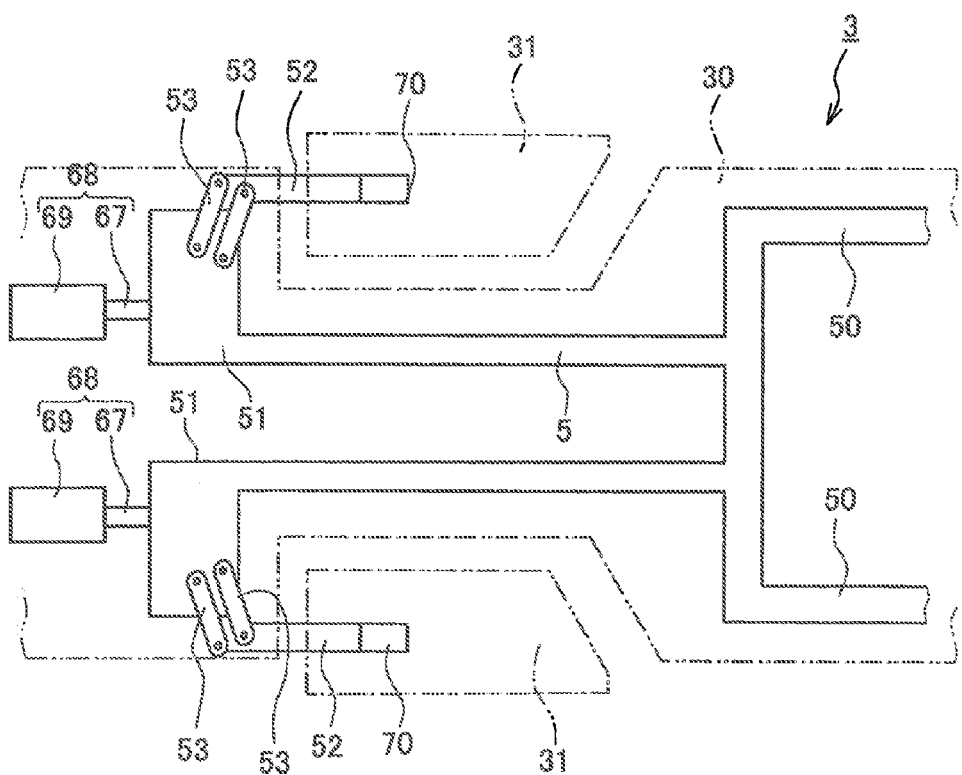

FIGS. 11A and 11B are plan views illustrating positional relations of the second drive piece 51 and the sub-slide body 52, not illustrating the configuration of the pitch changing mechanism 7 and the second holding portion 4B of the movable portion 31. FIG. 11A illustrates the position where the movable portion 31 turns in the advance direction corresponding to FIG. 2A. FIG. 11B illustrates the position where the movable portion 31 turns in the retreat direction corresponding to FIG. 2B. The first slider 70 driving the second holding portion 4B is provided to the distal end portion of the sub-slide body 52, and the second holding portion 4B is provided to the movable portion 31. Therefore, when the movable portion 31 turns in the forward and rearward direction, the sub-slide body 52 also moves in the forward and rearward direction. Each sub-slide body 52 is coupled to each other by the main slide body 5 and the coupling link 53 so that the sub-slide body 52 can move forward and rearward even in a state that the main slide body 5 is stopped.

Note that the coupling link 53 and the turning auxiliary link plate 63 and the small link plate 60 are in parallel with one another, and these links configure a parallelogram.

When the four-joint link mechanism 6 (refer to FIGS. 2A and 2B) actuates and the movable portion 31 turns in the retreat direction as illustrated in FIG. 11B from the state illustrated in FIG. 11A, the coupling link 53 turns about the mounting spot with the second drive piece 51 as the center, allowing the sub-slide body 52 to retreat in a state that the main slide body 5 is stopped. Thereby, the receiving portion 42 of the second holding portion 4B moves away from a peripheral edge portion of the semiconductor wafer 9 (refer to FIG. 2B).

When the four-joint link mechanism 6 actuates and the movable portion 31 turns in the advance direction as illustrated in FIG. 11A from the state illustrated in FIG. 11B, the receiving portion 42 of the second holding portion 4B comes in contact with a peripheral edge portion of the semiconductor wafer 9, and the semiconductor wafer 9 is held by the receiving portions 42 of the first holding portions 4A and the second holding portions 4B (refer to FIG. 2A).

In the state that the movable portion 31 rotates in the advance direction and the semiconductor wafer 9 is held by the receiving portions 42 of both the holding portions 4A, 4B as illustrated in FIG. 11A, the air cylinder 68 drives the main slide body 5 forward. The sub-slide body 52 also advances via the coupling link 53 in the state that the first drive piece 50 and the second drive piece 51 advance and the coupling link 53 does not rotate. Since the main slide body 5 and the sub-slide body 52 move interlockingly, the four first sliders 70 advance synchronously. Thereby, the first to fourth linearly moving portions 41A, 41B, 41C, 41D of the first holding portions 4A and the second holding portions 4B elevate synchronously. Since the four first sliders 70 advance by the same distance, four linearly moving bodies holding a single semiconductor wafer 9 elevate by the same height. Thereby, the semiconductor wafer 9 elevates in a horizontal posture.

In the end effector device 1 of the present embodiment, the first to four linearly moving portions 41A, 41B, 41C, 41D of the all pitch changing mechanisms 7 are elevated only by the forward and rearward movement operation of the first sliders 70. Thereby, the mechanism for driving the first to fourth linearly moving portions 41A, 41B, 41C, 41D so as to elevate them becomes simple.

<First Modified Example of Pitch Changing Mechanism>

Figure 12A:
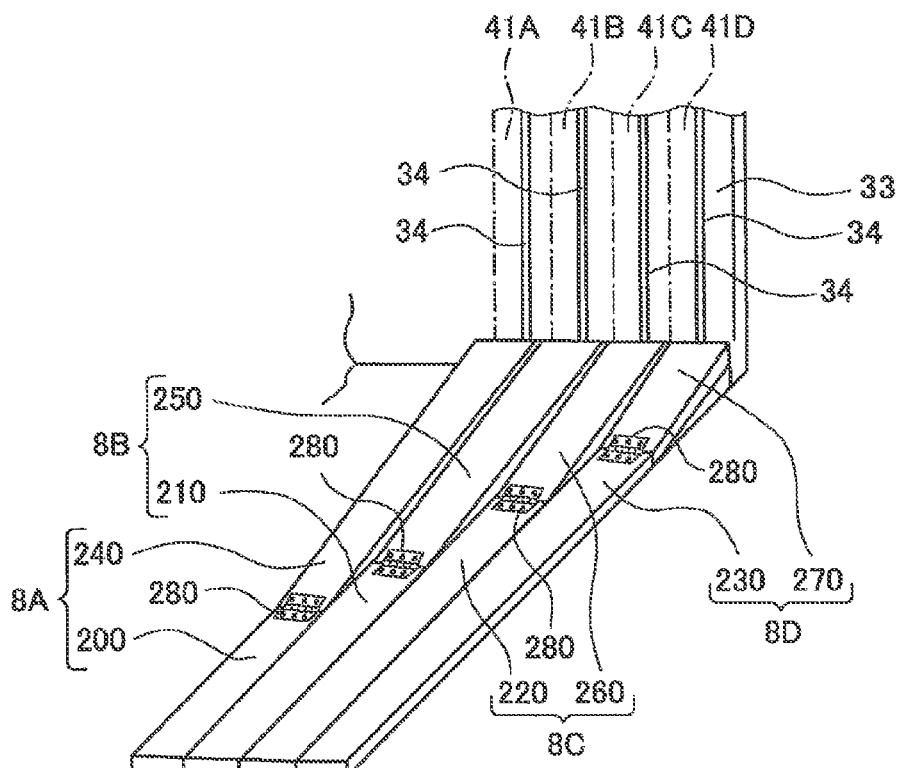
FIGS. 12A and 12B are perspective views illustrating a first modified example of the pitch changing mechanism.
Figure 12B:
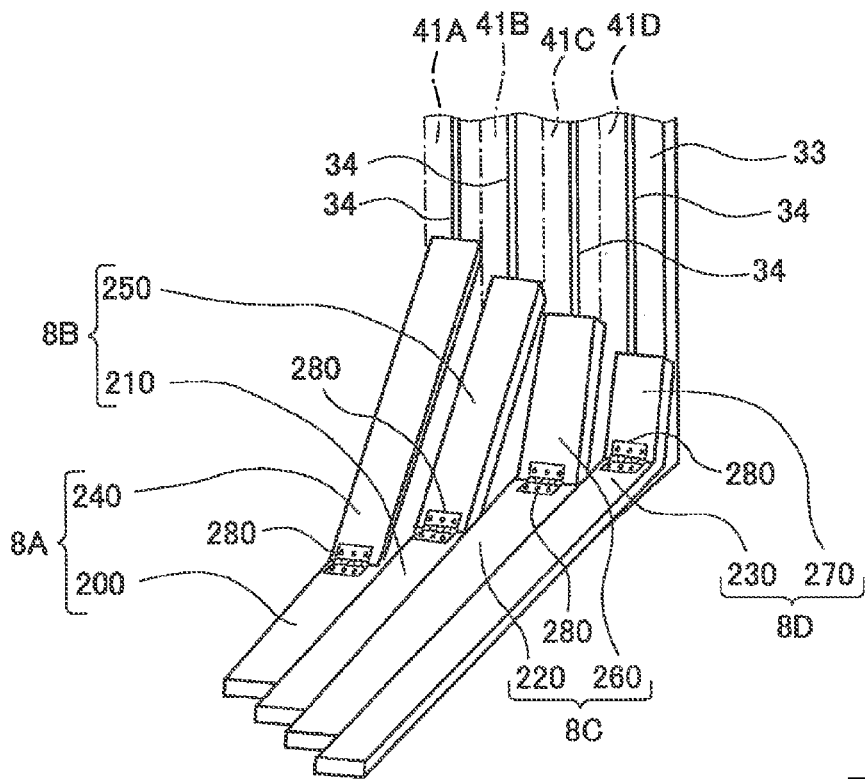

FIGS. 12A and 12B are perspective views illustrating a first modified example of the pitch changing mechanism 7. In the modified example, the first to fourth link mechanisms 8A, 8B, 8C 8D are arranged from the left side to the right side in the figure. Thereby, the first to fourth linearly moving portions 41A, 41B, 41C, 41D are also arranged from the left side to the right side in the figure. In the modified example, a configuration of the first to fourth link mechanisms 8A, 8B, 8C, 8D is different from the link mechanism mentioned above.

Specifically, as illustrated in FIG. 12A, the first link mechanism 8A is configured by a first link piece 200 driven forward and rearward in the horizontal posture facing its surface upward and a fifth link piece 240 connected vertically turnably to the distal end portion of the first link piece 200 by a hinge 280.

Similarly, the second link mechanism 8B is configured by a second link piece 210 longer than the first link piece 200 and a sixth link piece 250 connected turnably vertically to the distal end portion of the second link piece 210 by the hinge 280 and shorter than the fifth link piece 240. The third link mechanism 8C is configured by a third link piece 220 longer than the second link piece 210 and a seventh link piece 260 connected turnably vertically to the distal end portion of the third link piece 220 by the hinge 280 and shorter than the sixth link piece 250. The fourth link mechanism 8D is configured by a fourth link piece 230 longer than the third link piece 220 and an eighth link piece 270 connected turnably vertically to the distal end portion of the fourth link piece 230 by the hinge 280 and shorter than the seventh link piece 260.

The distal end portions of the fifth to eighth link pieces 240, 250, 260, 270 abut on the front wall 33. Thereby, the fifth to eighth link pieces 240, 250, 260, 270 are restricted from advancing. The fifth to eighth link pieces 240, 250, 260, 270 are connected with the corresponding first to fourth linearly moving portions 41A, 41B, 41C, 41D through vertically long holes 34 made on the front wall 33 respectively. The first to fourth link mechanisms 8A, 8B, 8C, 8D are driven forward and rearward by a common first slider (not illustrated).

When the first slider presses the first to fourth link pieces 200, 210, 220, 230 forward from the posture illustrated in FIG. 12A, the distal end portions of the fifth to eighth link pieces 240, 250, 260, 270 are abutted on the front wall 33 and restricted from advancing, and therefore, the fifth to eighth link pieces 240, 250, 260, 270 turn so that the distal end portions coupled to the first to fourth linearly moving portions 41A, 41B, 41C, 41D elevate about the hinges 280 as the centers as illustrated in FIG. 12B. Thereby, the receiving portions (not illustrated in FIGS. 12A and 12B) of the first to fourth linearly moving portions 41A, 41B, 41C, 41D can elevate receiving a peripheral edge portion of the semiconductor wafer 9.

<Second Modified Example of Pitch Changing Mechanism>

Figure 13A:
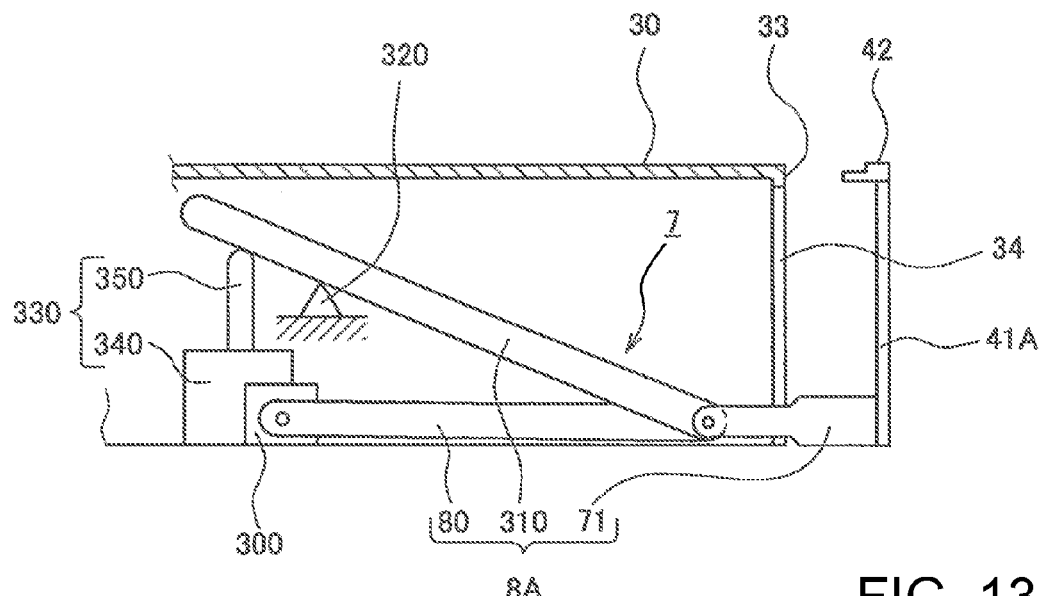
FIGS. 13A and 13B are side views illustrating a second modified example of the pitch changing mechanism.
Figure 13B:
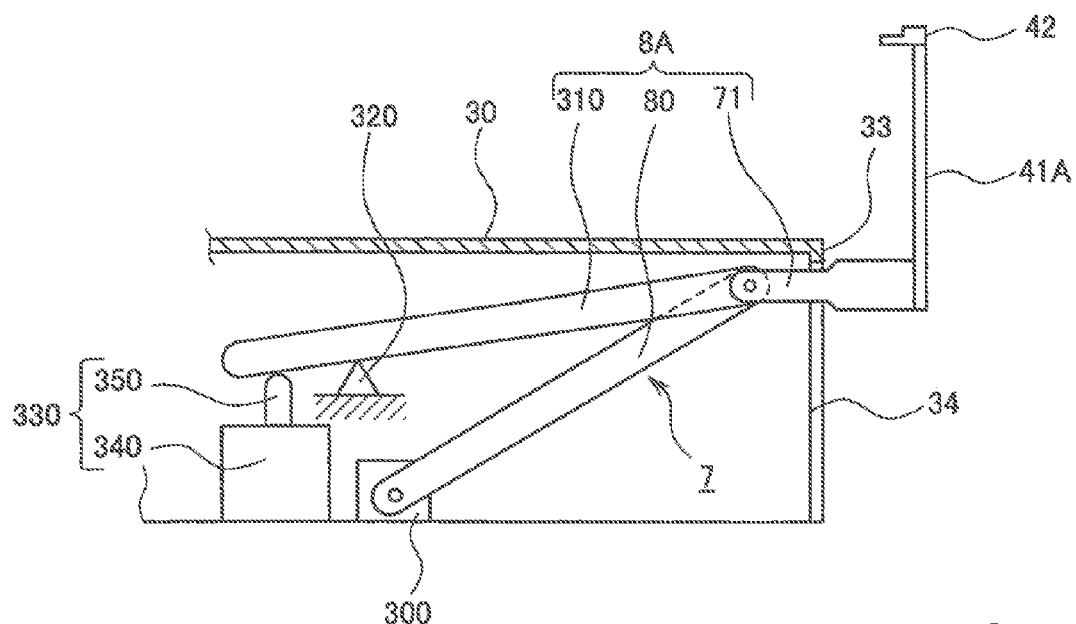

FIGS. 13A and 13B are side views illustrating a second modified example of the pitch changing mechanism 7. In the modified example, although the pitch changing mechanism 7 includes the first to fourth link mechanisms connected respectively to the first to fourth linearly moving portions 41A, 41B, 41C, 41D, the configuration of the link mechanisms are different from the configuration of the link mechanisms mentioned above. For convenience of explanation, only the first link mechanism 8A is illustrated.

The first link mechanism 8A includes a follower slider 300 sliding on the bottom surface of the body portion 30, the first link member 80 whose proximal end portion is mounted turnably on the follower slider 300, the second slider 71 mounted turnably on the distal end portion of the first link member 80 and fixed to the lower end portion of the first linearly moving portion 41, and an elongated rocking member 310 whose one end portion is mounted turnably on the distal end portion of the first link member 80.

The second slider 71 is fitted in the vertically long hole 34 made in the front wall 33 which is the front end portion of the body portion 30 and allowed to only move vertically similarly to the above-mentioned embodiment. The rocking member 310 rocks with an optional point in the longitudinal direction being supported at a fulcrum 320 in the body portion 30, and the other end portion of the rocking member 310 is opposed to an vertically drive actuator 330 arranged in the body portion 30. The vertically drive actuator 330 is configured to provide a vertically moving piston 350 vertically movable in a housing 340, and the distal end portion of the vertically moving piston 350 is connected to the other end portion of the rocking member 310.

In the state illustrated in FIG. 13A, the vertically moving piston 350 elevates and the first linearly moving portion 41A is positioned at the lowermost level. When the vertically moving piston 350 lowers from this state, the rocking member 310 rocks about the fulcrum 320 as the center, and one end portion of the rocking member 310 and the distal end portion of the first link member 80 move upward as illustrated in FIG. 13B. Thereby, the receiving portion 42 of the first linearly moving portion 41A reaches the uppermost level.

<Third Modified Example of Pitch Changing Mechanism>

Figure 14A:
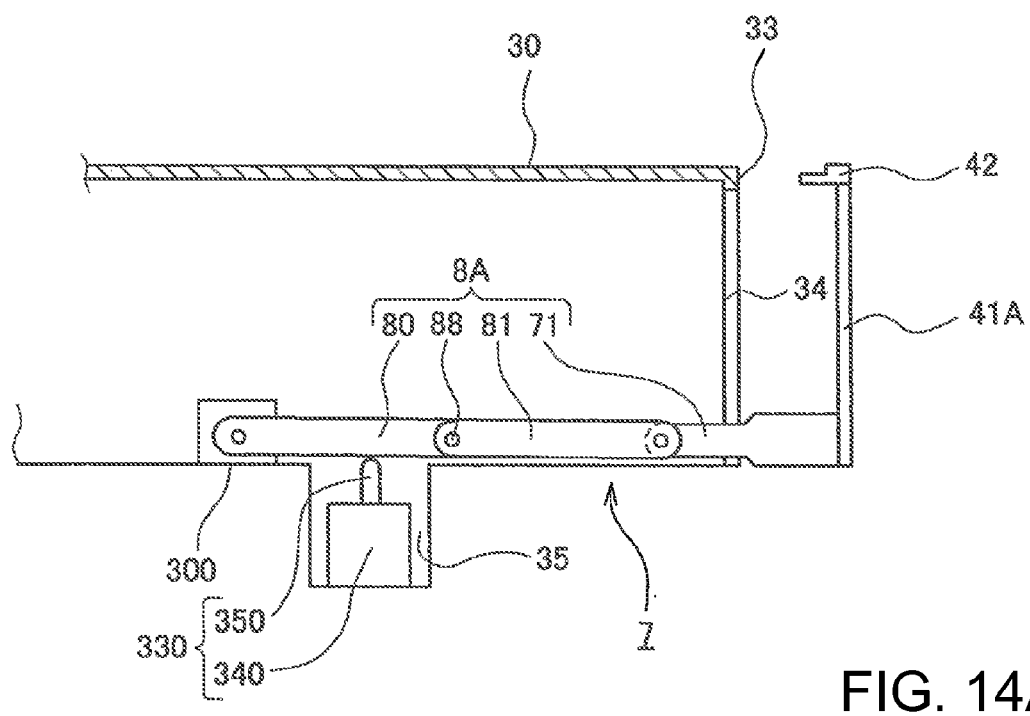
FIGS. 14A and 14B are side views illustrating a third modified example of the pitch changing mechanism.
Figure 14B:
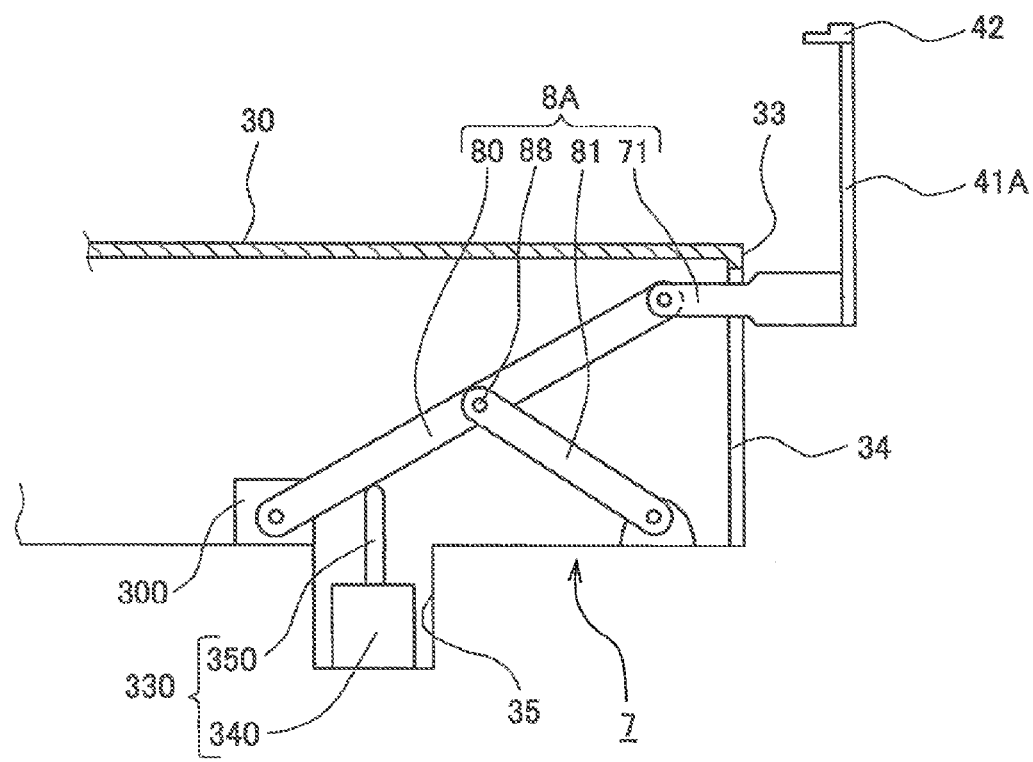

FIGS. 14A and 14B are side views illustrating a third modified example of the pitch changing mechanism 7. Also in the modified example, the configuration of the first to fourth link mechanisms is different from the configuration of the link mechanisms mentioned above. For convenience of explanation, only the first link mechanism 8A is illustrated.

As illustrated in FIG. 14A, the first link mechanism 8A includes the follower slider 300 sliding on the bottom surface of the body portion 30, the elongated first link member 80 whose proximal end portion is mounted turnably on the follower slider 300, the second link member 81 mounted turnably about the connecting shaft 88 whose distal end portion is positioned in the center portion in the longitudinal direction of the first link member 80 and whose proximal end portion is mounted turnably on the bottom surface of the body portion 30, and the second slider 71 mounted turnably on the distal end portion of the first link member 80 and fixed to the lower end portion of the first linearly moving portion 41A.

A recessed portion 35 is formed on the bottom surface of the body portion 30, and the vertically drive actuator 330 opposed to the lower surface of the proximal end portion of the first link member 80 is arranged in the recessed portion 35. The vertically drive actuator 330 is configured to provide the vertically moving piston 350 so as to be movable vertically in the housing 340 as mentioned above, and the distal end portion of the vertically moving piston 350 is connected to the proximal end portion of the first link member 80.

In the state illustrated in FIG. 14A, the first linearly moving portion 41A is positioned at the lowermost level. When the vertically moving piston 350 elevates from this state, the first link member 80 turn about the mounting portion with the follower slider 300 as the center and also the follower slider 300 advances. The distal end portion of the first link member 80 and the distal end portion of the second link member 81 are vertically moved. Thereby, the receiving portion 42 of the first linearly moving portion 41A reaches the uppermost level.

<Modified Example of Receiving Portion>

Figure 15A:
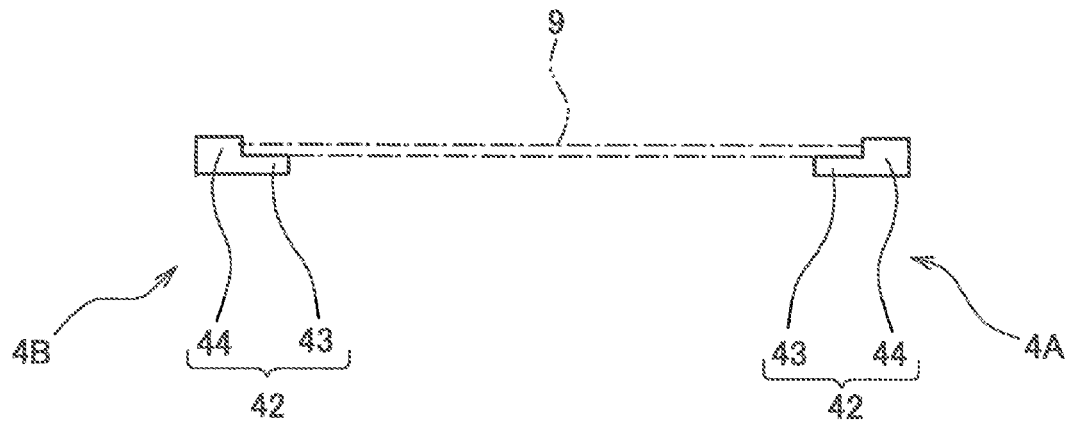
FIGS. 15A and 15B are side views illustrating a modified example of the receiving portion.

In the descriptions mentioned above, the lower surface of the peripheral edge portion of the semiconductor wafer 9 is supported by the horizontal piece 43 of the receiving portion 42, as illustrated in FIG. 15A. However, alternatively, as illustrated in FIG. 15B, the receiving portion 42 may be formed so that, in the inner surface thereof, a first inclined surface 45 and a second inclined surface 46 whose gradient is more gentle than the first inclined surface 45 are continued and a boundary line SM of both the inclined surfaces 45, 46 supports a peripheral portion of the semiconductor wafer 9.

Figure 15B:
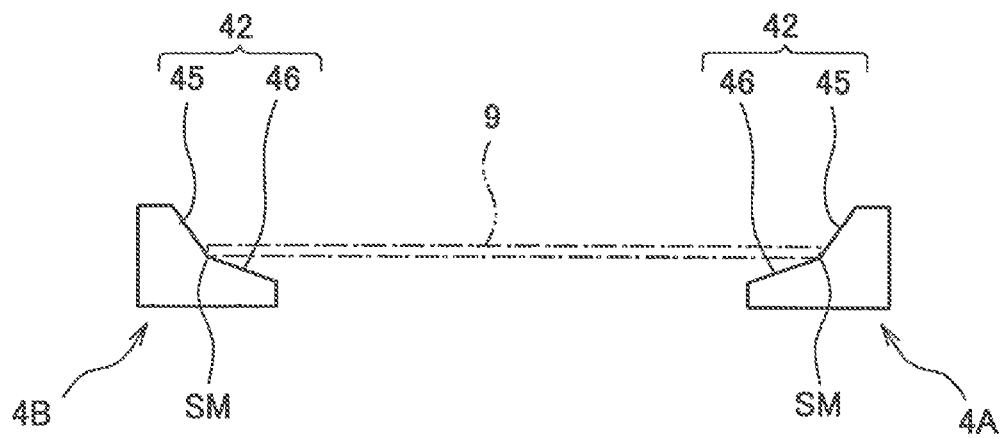

In the configuration illustrated in FIG. 15B, the semiconductor wafer 9 slides on the first inclined surface 45 of the receiving portion 42 so as to be placed on the boundary line SM when it is held by the receiving portion 42. Thereby, a horizontal position and a horizontal posture of the semiconductor wafer 9 are corrected and held suitably. Also, since the receiving portion 42 and the semiconductor wafer 9 are in line contact with each other, a contact area between the receiving portion 42 and the semiconductor wafer 9 is small. Thereby, foreign matters adhered to the semiconductor wafer 9 are reduced.

Herein, holding the semiconductor wafer 9 means making the semiconductor wafer 9 in a state that it can be conveyed by the hand 3, and another aspect such as placement or adsorption other than the embodiment mentioned above may by employed. In this case, for example, the receiving portion 42 can be configured by only the horizontal piece 43 or the horizontal piece 43 and an adsorption pad.

(Merit of Using the Present Invention for Semiconductor Wafer with Large Diameter)

In the semiconductor industry, a semiconductor wafer with a large diameter is being used in phases. Specifically, while a semiconductor wafer with a diameter of about 150 mm is used conventionally, a semiconductor wafer with a diameter of about 200 mm or 300 mm is being used recently, and there is a possibility that a semiconductor wafer with a diameter of about 450 mm is used in the future.

Note that, in the above-listed Patent Document 2, a configuration that a plurality of substrate holding members supported at their proximal end portions are inserted between a plurality of substrates so as to convey the substrates is described. When an enlarged semiconductor wafer is to be conveyed by a configuration of such a conventional technique, deflection of a robot which is enlarged in accordance with the enlargement of the semiconductor wafer or deflection of the semiconductor wafer itself increases for the enlargement of the semiconductor wafer. Thereby, a problem of interference between a substrate holding member and a semiconductor wafer increases.

The problem can be avoided by sufficiently enlarging an interval between a plurality of arranged semiconductors wafers. However, for saving space of a device, it is preferable that a plurality of semiconductor wafers are arranged at an interval as small as possible. As for the interval, it is preferable that an interval from the lower surface of a semiconductor wafer to the lower surface of the adjacent semiconductor is 5 mm to 10 mm, preferably 6 mm, for example.

In this regard, by a configuration of the present invention, a plate member such as the substrate holding member in the conventional technique mentioned above does not need to be inserted between a plurality of semiconductor wafers. Accordingly, the problem of interference between a hand and a semiconductor wafer is alleviated.

As stated above, the present invention can be applied to a hand gripping a large semiconductor wafer (particularly, a semiconductor wafer with a diameter of 450 mm or more). Also, the present invention can be applied to a processing device, a conveying device, or a semiconductor processing device having at least one substrate placing portion including the FOUP 90 or another spot to which a plurality of semiconductor wafers are arranged at an interval of 5 mm to 10 mm, preferably 6 mm.

Although the first holding portion 4A and the second holding portion 4B are provided two for each of them in the description mentioned above, they may be provided one or more for each of them. However, since a peripheral edge of the semiconductor wafer 9 needs to be supported at three or more points in order to position the semiconductor wafer 9 in the horizontal plane, the first holding portion 4A and the second holding portion 4B need to be provided so as to be supported at three or more points in total.

Also, although the pitch changing mechanism 7 widens a vertical pitch of adjacent semiconductor wafers 9 when conveying a plurality of semiconductor wafers 9 from the FOUP 90 to another spot in the description mentioned above, the vertical pitch may be narrowed.

Although the embodiment that the four first sliders 70 are driven synchronously forward and rearward is illustrated in FIG. 10 mentioned above or the like, the first sliders 70 of the respective pitch changing mechanisms 7 do not necessarily need to be connected to each other physically. For example, an actuator such as an air cylinder may be provided individually for each first slider 70 of each pitch changing mechanism 7. In this case, it is desirable that the operation timing of an actuator such as an air cylinder provided individually is synchronized.

INDUSTRIAL APPLICABILITY

The present invention is useful for an end effector device provided with a pitch changing mechanism which changes a vertical pitch of a plurality of plate members arranged vertically at intervals.

DESCRIPTION OF REFERENCE NUMERALS

1 . . . End effector device
2 . . . Plate member conveying robot
3 . . . Hand
5 . . . Main slide body
7 . . . Pitch changing mechanism
8A . . . Link mechanism
9 . . . Semiconductor wafer
30 . . . Body portion
31 . . . Movable portion
40A . . . First linearly moving body
41A . . . First linearly moving portion

The invention claimed is:

1. An end effector device comprising:
a hand having a storing space; and
a plurality of holding portions provided to the hand and configured to hold parts of each of a plurality of plate members so as to hold the plurality of plate members respectively, the parts being different from each other in a peripheral direction of a peripheral edge portion of each plate member respectively,
wherein each of the holding portions includes a plurality of receiving portions which respectively receive peripheral edge portions of the plurality of plate members so that the plurality of plate members are arranged substantially parallel with one plane and at an interval or intervals mutually in a first direction which is substantially perpendicular to the one plane, and a pitch changing mechanism configured to linearly move the plurality of receiving portions in the first direction respectively so as to change the interval or intervals,
wherein a plurality of linearly moving portions configured to respectively move linearly integrally with the plurality of receiving portions of the pitch changing mechanism are provided to the hand so as to be exposed outside of the hand, and
wherein a plurality of drive portions configured to drive the plurality of linearly moving portions of the pitch changing mechanism respectively are stored in the storing space of the hand.

2. The end effector device according to claim 1, wherein the hand includes a hollow body portion formed so as to extend in a second direction substantially parallel with the one plane, and a hollow movable portion connected to a proximal end portion of the body portion so as to be capable of advancing and retreating in the second direction, and
wherein the plurality of holding portions include first holding portions provided to a distal end portion of the body portion and second holding portions provided to the movable portion.

3. The end effector device according to claim 2, wherein the end effector device is configured so that the peripheral edge portions of the plurality of plate members are held by being gripped by the first holding portions and the second holding portions when the movable portion advances, and the peripheral edge portions of the plurality of plate members are released from the second holding portions when the movable portion retreats.

4. The end effector device according claim 3, wherein the first holding portions and the second holding portions respectively include a plurality of linearly moving bodies which have distal end portions in the first direction forming the receiving portions and remaining portions constituting the linearly moving portions,
wherein the drive portion corresponding the linearly moving portion includes a first slider configured to linearly move in the second direction and a link mechanism configured to connect the first slider and the linearly moving body to each other so as to change a linear movement of the first slider into a linear movement in the first direction, and
wherein the link mechanism is configured to linearly move the linearly moving body only by a linear movement distance corresponding to an arrangement order position in the first direction of the plate member to be received by the receiving portion.

5. The end effector device according claim 2, wherein the first holding portions and the second holding portions respectively include a plurality of linearly moving bodies which have distal end portions in the first direction forming the receiving portions and remaining portions constituting the linearly moving portions,
wherein the drive portion corresponding the linearly moving portion includes a first slider configured to linearly move in the second direction and a link mechanism configured to connect the first slider and the linearly moving body to each other so as to change a linear movement of the first slider into a linear movement in the first direction, and
wherein the link mechanism is configured to linearly move the linearly moving body only by a linear movement distance corresponding to an arrangement order position in the first direction of the plate member to be received by the receiving portion.

6. The end effector device according claim 1, wherein the first holding portions and the second holding portions respectively include a plurality of linearly moving bodies which have distal end portions in the first direction forming the receiving portions and remaining portions constituting the linearly moving portions,
wherein the drive portion corresponding the linearly moving portion includes a first slider configured to linearly move in the second direction and a link mechanism configured to connect the first slider and the linearly moving body to each other so as to change a linear movement of the first slider into a linear movement in the first direction, and
wherein the link mechanism is configured to linearly move the linearly moving body only by a linear movement distance corresponding to an arrangement order position in the first direction of the plate member to be received by the receiving portion.

7. The end effector device according claim 6, wherein the link mechanism comprises:
   a first link member having a proximal end portion which is connected to the first slider so as to be rotatable about a first axis line perpendicular to the first direction;
   a second link member having a proximal end portion which is connected to the first link member so as to be rotatable about a second axis line parallel with the first axis line; and
   a second slider configured to be slidable in the first direction along a slide surface parallel with the first direction, a distal end of the second link member being connected to the second slider so as to be rotatable about a third axis line parallel with the first axis line, and a lower end portion of the linearly moving body being connected to the second slider,
   wherein the plurality of link mechanisms of each of the holding portions are configured so that, under a state in which the first link member is perpendicular to the first direction, a sum of a first distance between the first axis line and the second axis line and a second distance between the second axis line and the third axis line is a given distance which is identical to one another among the plurality of link mechanisms, respectively, and due to a linear movement of the first slider, under a state in which the first link member has rotated about the first axis line, a ratio of the second distance to the given distance is different from one another among the plurality of link mechanisms according to the linear movement distance.

8. The end effector device according claim 7, further comprising: a biasing mechanism configured to bias the first link member to a direction opposite to a dead point of the first link member and the second link member.

9. The end effector device according claim 8, wherein the link mechanism is provided with a cylinder configured to drive the first slider, the first link member, or the second slider.

10. The end effector device according claim 7, wherein the link mechanism is provided with a cylinder configured to drive the first slider, the first link member, or the second slider.

* * * * *